US 7,250,637 B2

(12) United States Patent
Shimizu et al.

(10) Patent No.: US 7,250,637 B2
(45) Date of Patent: *Jul. 31, 2007

(54) CARD TYPE LED ILLUMINATION SOURCE

(75) Inventors: Masanori Shimizu, Kyotanabe (JP); Tadashi Yano, Kyoto (JP); Tatsumi Setomoto, Takatsuki (JP); Nobuyuki Matsui, Takatsuki (JP); Tetsushi Tamura, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/277,952

(22) Filed: Mar. 30, 2006

(65) Prior Publication Data

US 2006/0160409 A1    Jul. 20, 2006

Related U.S. Application Data

(60) Division of application No. 11/158,836, filed on Jun. 22, 2005, now Pat. No. 7,045,828, which is a division of application No. 10/374,614, filed on Feb. 26, 2003, now Pat. No. 6,949,772, which is a continuation of application No. PCT/JP02/08151, filed on Aug. 8, 2002.

(30) Foreign Application Priority Data

Aug. 9, 2001 (JP) ............................. 2001-242857

(51) Int. Cl.
*H01L 33/00* (2006.01)

(52) U.S. Cl. ................. 257/98; 257/100; 257/E33.072; 257/E33.075; 257/99

(58) Field of Classification Search .......... 257/98–100, 257/E33.059, E33.058, E33.072, E33.075; 362/800
See application file for complete search history.

(56) References Cited

U.S. PATENT DOCUMENTS

| 5,670,250 | A | 9/1997 | Sanville, Jr. et al. |
| 6,412,971 | B1 | 7/2002 | Wojnarowski et al. |
| 6,791,119 | B2 | 9/2004 | Slater, Jr. et al. |
| 6,834,981 | B2 | 12/2004 | Nagai |
| 6,891,200 | B2 | 5/2005 | Nagai |
| 6,949,772 | B2 | 9/2005 | Shimizu |
| 7,045,828 | B2 * | 5/2006 | Shimizu et al. ............... 257/98 |

FOREIGN PATENT DOCUMENTS

| EP | 1 059 667 A2 | 12/2000 |
| EP | 1 059 668 A2 | 12/2000 |
| EP | 1 059 678 A2 | 12/2000 |

(Continued)

*Primary Examiner*—Minh-Loan Tran
(74) *Attorney, Agent, or Firm*—Akin Gump Strauss Hauer & Feld LLP

(57) ABSTRACT

An LED illumination source comprises a heat dissipating substrate which includes a metal plate and at least two insulating layers thereon. LED bare chips are mounted on a surface of the substrate. An optical reflector with holes surrounds the LED bare chips. The optical reflector is provided on the surface of the substrate on which the LED bare chips are mounted. A resin encapsulates the entire optical reflector on the substrate, the resin molding each of the LED bare chips and functioning as an optical lens for each of the LED bare chips.

7 Claims, 25 Drawing Sheets

FOREIGN PATENT DOCUMENTS

| | | |
|---|---|---|
| JP | 03-003276 A | 1/1991 |
| JP | 03-004572 A | 1/1991 |
| JP | 08-025689 A | 1/1996 |
| JP | 11-191641 A | 7/1999 |
| JP | 11-251639 A | 9/1999 |
| JP | 2000-021209 A | 1/2000 |
| JP | 2001-338505 | 7/2001 |

* cited by examiner

FIG.2 (a) PRIOR ART
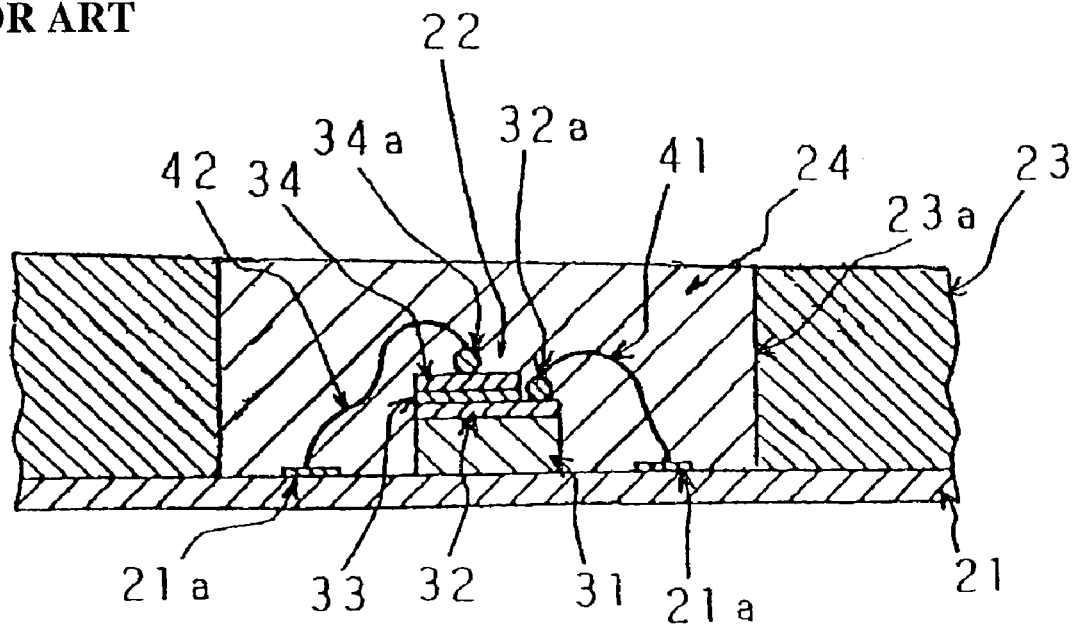
FIG.2 (b) PRIOR ART
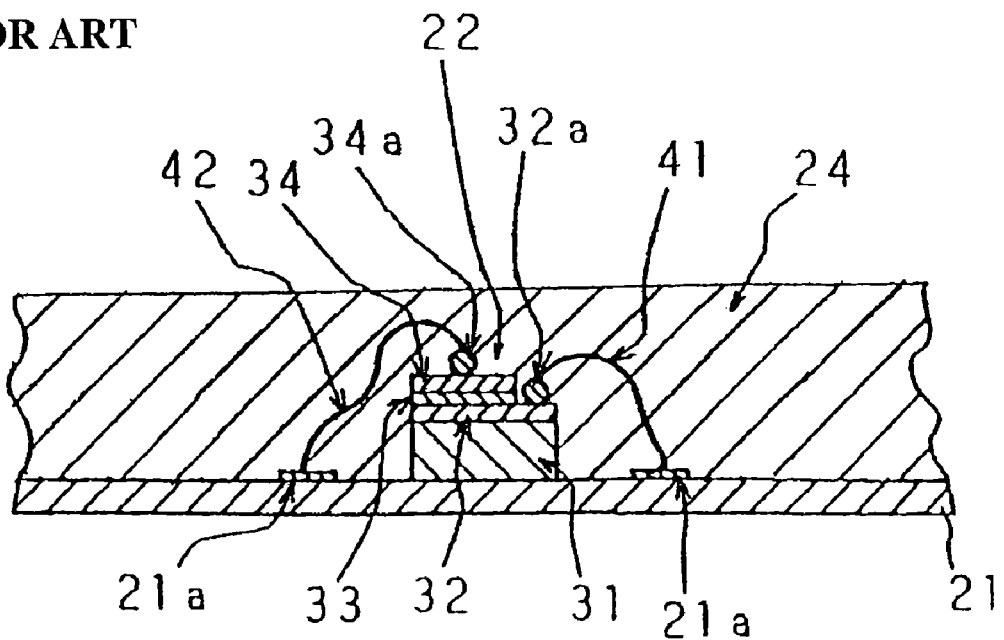

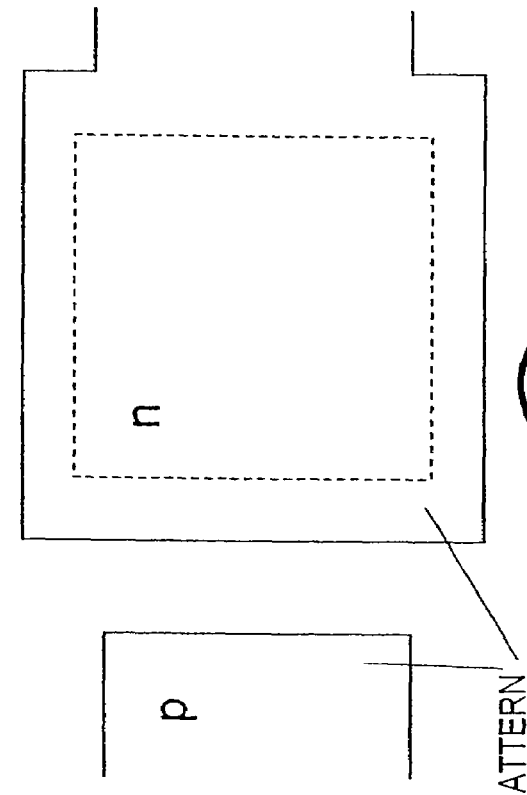
FIG.19(a)
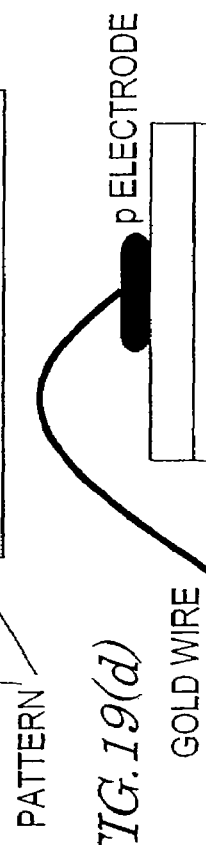
FIG.19(b)
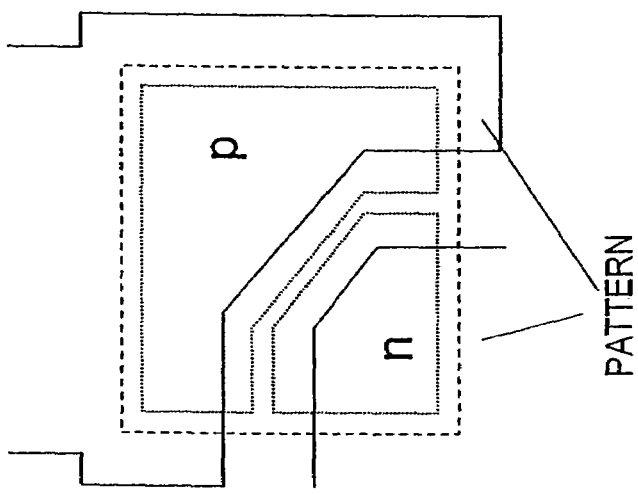
FIG.19(d) GOLD WIRE
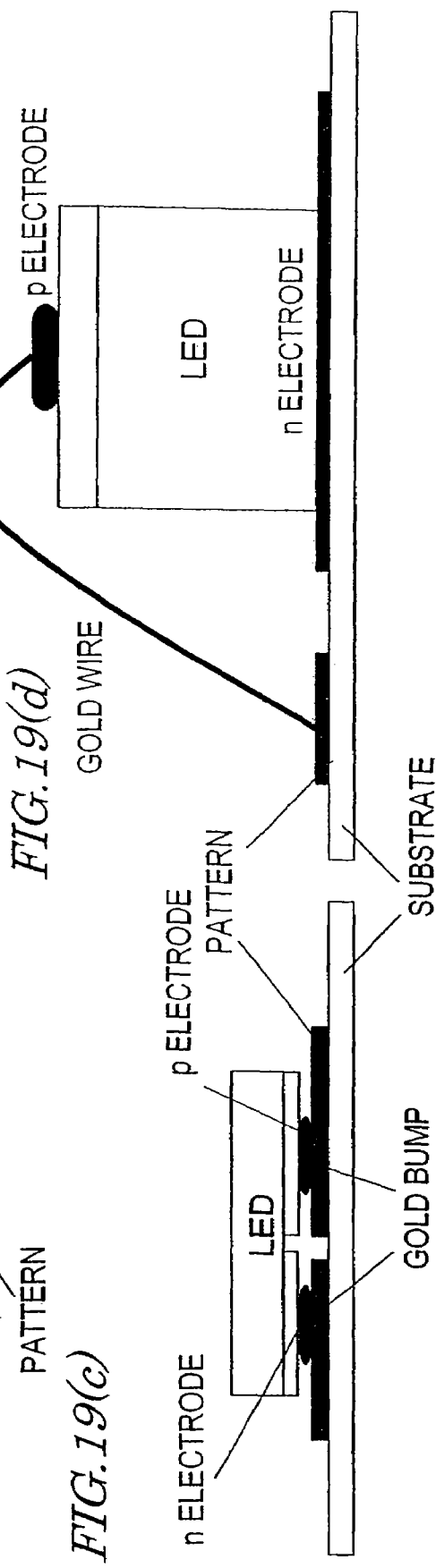
FIG.19(c)

US 7,250,637 B2

CARD TYPE LED ILLUMINATION SOURCE

CROSS-REFERENCE TO RELATED APPLICATIONS

This application is a Divisional U.S. patent application Ser. No. 11/158,836, filed Jun. 22 2005 now U.S. Pat. No. 7,045,828; which is a Divisional of U.S. patent application Ser. No. 10/374,614, filed Feb. 26, 2003, now U.S. Pat. No. 6,949,772 which is a Continuation of PCT/JP2002/008151, filed Aug. 8, 2002.

BACKGROUND OF THE INVENTION

The present invention relates to an LED (Light Emitting Diode) illumination apparatus and a card-type LED illumination source. More specifically, the present invention relates to an LED illumination apparatus that uses a card-type LED illumination source on which multiple LEDs are mounted, and also relates to such a card-type LED illumination source that can be used effectively in that LED illumination apparatus.

Incandescent lamps, fluorescent lamps, high-pressure discharge lamps and other types of lamps have been used as luminaires or light sources for billboards. Recently, an LED illumination source has been researched and developed as a new type of illumination source that could potentially replace these conventional light sources. An LED illumination source has a longer life than any of those conventional light sources, which is one of its advantageous features, and is widely expected to be a next-generation illumination source. To obtain a luminous flux comparable to that of an incandescent lamp or a fluorescent lamp, however, the LED illumination source needs to be an array of multiple LED elements because a single LED element has just a small luminous flux.

Hereinafter, conventional LED illumination sources will be described with reference to the accompanying drawings. FIGS. 1(a) and 1(b) illustrate configurations of two conventional LED illumination sources. FIGS. 2(a) and 2(b) illustrate cross-sectional structures of LEDs included in the two types of LED 25 illumination sources.

Each of these LED illumination sources includes a substrate 21 as shown in FIGS. 1(a) and 1(b). On the substrate 21, a number of LED bare chips 22 are mounted. As used herein, the "LED bare chip" refers to an LED that is yet to be mounted and yet to be molded with a resin, for example. For the sake of clarity, an LED that has already been molded so as not to expose its light emitting portion but still has not been mounted yet will be herein referred to as an "LED element". On the substrate 21 shown in FIG. 1(a), a plate 23, including multiple holes 23a to transmit the light that has been emitted from the LED bare chips 22, is provided. On the other hand, on the substrate 21 shown in FIG. 1(b), a layered resin 24 that also transmits the light emitted from the LED bare chips 22 is provided. That is to say, the LED bare chips 22 are covered with the resin 24.

In each of these LED illumination sources, the LED bare chip 22 is mounted in a bare chip state on the substrate 21 as shown in FIGS. 2(a) and 2(b). The LED bare chip 22 includes a chip substrate 31 of sapphire, SiC, GaAs or GaP, and a light emitting portion that has been formed on the chip substrate 31. The light emitting portion is formed by stacking an n-type semiconductor layer 32 of GaN, for example, an active layer 33, and a p-type semiconductor layer 34 in this order. The electrode 32a of the n-type semiconductor layer 32 and the electrode 34a of the p-type semiconductor layer 34 are electrically connected to conductive lines 21a on the substrate 21 by way of Au wires 41 and 42, respectively. It should be noted that this configuration of the light emitting portion is just an illustrative one. Thus, the LED may have a quantum well, a Bragg reflector layer, or a resonant cavity structure.

In the configuration shown in FIGS. 1(a) and 2(a), the light that has been emitted from the LED bare chip 22 is reflected from a reflective plane 23a, which is the inner surface of a hole (or opening) 23b of the plate 23, and then goes out of the element. The hole 23b of the plate 23 is filled with the resin 24 so as to mold the LED bare chip 22 and the wires 41 and 42 together. On the other hand, in the configuration shown in FIGS. 1(b) and 2(b), the light that has been emitted from the LED bare chip 22 goes out of the element through the molding resin 24.

In the LED bare chip 22, when a forward bias voltage is applied between the electrodes 32a and 34a of the n- and p-type semiconductor layers 32 and 34, electrons and holes are injected into these semiconductor layers and recombine with each other. As a result of this recombination, light is created in, and emitted from, the active layer 33. In an LED illumination source, the light, emitted from multiple LED bare chips 22 that have been mounted on the substrate, is utilized as illumination.

The LED bare chip 22 generates a lot of heat when emitting the light. The heat generated is supposed to be dissipated from the substrate 21 by way of the chip substrate 31. However, to make such an LED illumination apparatus a commercially viable product, the following problems must be solved.

As described above, the luminous flux of each one of the LED bare chips 22 is small. Accordingly, to achieve desired brightness, quite a few LED bare chips 22 need to be arranged on the substrate 21. To avoid an excessive increase in size of the substrate even when a great number of LED bare chips 22 are arranged thereon, the LED bare chips 22 need to be mounted at an increased density.

Also, to increase the luminous flux of each LED bare chip 22 as much as possible, a current to be supplied to the LED bare chip 22 (e.g., an eddy current of about 40 mA with a current density of about 444.4 mA/mm$^2$ per unit area, for example) needs to be greater than a current that is supplied for normal purposes other than illumination (e.g., about 20 mA with a current density of about 222.2 mA/mm$^2$ per unit area for a 0.3 mm square LED bare chip, for example). However, when such a great amount of current is supplied to each LED bare chip 22, an increased quantity of heat is generated from the LED bare chip 22. As a result, the temperature of the LED bare chip 22 (which will be herein referred to as a "bare chip temperature") rises to reach a rather high level. Generally speaking, the bare chip temperature has significant effects on the life of the LED bare chip. More specifically, it is said that when the bare chip temperature rises by 10° C., the life of an LED apparatus, including the LED bare chip 22, should be halved.

An LED is usually believed to have a long life. However, it is quite a different story if the LED is used for illumination purposes. What is worse, when the bare chip temperature rises with the increase in the quantity of heat generated, the luminous efficacy of the LED bare chip 22 decreases unintentionally.

In view of these considerations, to realize an LED illumination apparatus with a huge number of LED bare chips 22 mounted thereon at a high density, the heat dissipation performance should be improved, and the bare chip temperature should be decreased, compared to the conventional ones. The optical efficiency also needs to be increased to utilize the light, emitted from the LED bare chips 22, as illumination as efficiently as possible, or with the waste of the optical energy minimized.

To overcome these problems, various types of LED illumination sources with an array of LED bare chips thereon have been proposed. However, none of those conventional LED illumination sources has ever succeeded in coping with all of those problems satisfactorily.

Hereinafter, the problems of the conventional LED illumination sources will be described with reference to FIGS. 1(*a*), 1(*b*), 2(*a*) and 2(*b*). Firstly, if the LEDs are kept ON continuously for a long time, the center portion of the substrate, having the huge number of LEDs integrated thereon, gets more and more heated. As a result, the difference in temperature between the center and peripheral portions of the LED substrate escalates with time. The configuration shown in FIGS. 1(*a*) and 2(*a*) is adopted for an LED dot matrix display, for example. In an LED display, the plate 23 works in such a manner as to increase the contrast between the emitting and non-emitting portions of each LED. When LEDs are used for a display like this, not all of those LEDs are always kept ON at full power. Thus, not so serious a heat generation problem should happen in such a situation. However, when LEDs are used to make an illumination apparatus, all of those LEDs must be kept ON for a long time, thus causing a non-negligible heat generation problem.

In the conventional examples described above, the substrate 21 and the plate 23, both made of the same resin, are combined together, and have substantially the same thermal expansion coefficients. However, a resin material normally has a low thermal conductivity, and easily stores the heat generated. For that reason, such a resin material cannot be used so effectively in an illumination apparatus that should always be kept ON at the maximum output power.

Also, since there is a difference in temperature between the center and peripheral portions of the substrate 21 to be combined with the plate 23, a difference is also created between the thermal expansion coefficient of the center portion and that of the peripheral portion, thus imposing a great stress in the peripheral portion of the substrate. When LEDs are used in an illumination apparatus, a stress is caused by the heat every time the LEDs are turned ON and OFF repeatedly, which eventually leads to disconnection of the electrodes 32*a* or 34*a* of the LEDs.

The substrate itself may include a portion, which is as thick as the plate 23 and which is made of a material with a thermal conductivity that is approximately equal to the high thermal conductivity of the substrate material, instead of the plate 23 separately provided. Then, that substrate may include recesses to mount LED bare chips thereon. Even so, the heat-dissipating and uniform thermal distributing performance is also limited by the thermal conductivity of the substrate material.

Furthermore, when the above-described configuration is adopted, the substrate itself needs to be thick enough and the substrate to mount the LED bare chips 22 thereon cannot have a reduced thickness. For that reason, even if the substrate material has a high thermal conductivity, the heat is still stored easily in the substrate. Accordingly, when kept energized or ON for a long time with a great amount of current supplied as in an illumination apparatus, the LED bare chips, mounted around the center of the substrate, in particular, will have noticeably increased temperatures, thus creating a big temperature difference between the center and peripheral portions of the substrate. Consequently, the properties of the substrate material with the high thermal conductivity cannot be made full use of, and the heat dissipation problem is still insoluble. Furthermore, unless the recesses to be provided on the surface of the substrate have relatively large sizes, a sufficient space cannot be allowed to mount the LED bare chips 22 thereon and conductive line the LED bare chips 22 by the wire bonding technique. In addition, the optical system used should have an increased size. Also, it is currently difficult to mount the LED bare chips 22 inside the recesses considering the capillary and collet sizes of bonders of various types. That is to say, to get the capillary or collet inserted into the recess, the recess and the optical system (i.e., the light outgoing region) should have increased sizes.

In the configuration shown in FIGS. 1(*b*) and 2(*b*) on the other hand, one side of the substrate 21 is covered with the molding resin 24. Accordingly, the time it takes to cure the molding resin 24 in the center portion of the substrate is different from the time it takes to cure the same resin 24 in the peripheral portion thereof. As a result, a great residual stress is produced inside the resin. Furthermore, since the light that has been emitted from one LED bare chip 22 is absorbed into other LED bare chips 22 (i.e., self-absorption by LEDs), the light-extraction efficiency of the overall LED illumination source decreases. Moreover, since the molding resin 24 functions as a heat storage material, a temperature difference is created between the center and peripheral portions of the substrate. In that case, the thermal expansion coefficient also varies on the same substrate, thus propagating the stress of the molding resin 24 to the peripheral portion of the substrate.

BRIEF SUMMARY OF THE INVENTION

In order to overcome the problems described above, an object of the present invention is to provide an LED illumination source and LED illumination apparatus that can solve all of these problems (i.e., increasing the density of integration and improving the heat dissipation performance and optical efficiency) at the same time.

An LED illumination apparatus according to the present invention includes: at least one connector to be connected to an insertable and removable card-type LED illumination source, which includes multiple LEDs that have been mounted on one surface of a substrate; and a lighting drive circuit to be electrically connected to the card-type LED illumination source by way of the connector.

In a preferred embodiment, the substrate is a metal base substrate. An insulating layer and a conductive line pattern are provided on the surface of the metal base substrate such that the LEDs are mounted thereon.

In another preferred embodiment, the LEDs have been mounted in a bare chip state on the substrate.

In another preferred embodiment, feeder terminals are provided at one end of the surface of the substrate on which the LEDs have been mounted, and the center of a light outgoing region of the substrate, in which the LEDs mounted are located, is shifted from the center of the substrate.

In another preferred embodiment, the LED illumination apparatus includes a thermal conductor member. The thermal conductor member thermally contacts with the back surface of the substrate, on which none of the LEDs is mounted, and receives heat from the back surface of the substrate.

In another preferred embodiment, the area of a contact portion between the back surface of the substrate and the thermal conductor member is equal to or greater than the area of the light outgoing region of the substrate in which the LEDs mounted are located.

In another preferred embodiment, the illumination apparatus further includes a feeder base for externally supplying electrical energy to the lighting drive circuit.

In another preferred embodiment, the feeder base is a base for a light bulb.

In another preferred embodiment, the illumination apparatus includes a housing, which transmits light emitted from the card-type LED illumination source that is connected to the connector. This housing may have various optical properties to reflect, refract and diffuse the light.

In another preferred embodiment, the illumination apparatus includes: a receiving portion, on/from which the card-type LED illumination source is fixable and removable; and stopper means for keeping the card-type LED illumination source from dropping from the receiving portion. The stopper means operates in such a manner as to allow a human user to remove the card-type LED illumination source from the receiving portion with his or her fingers.

In another preferred embodiment, the surface of the substrate on which the LEDs have been mounted has a substantially rectangular shape. The receiving portion includes a guide for getting the card-type LED illumination source slid and guided thereon. When fixed on the receiving portion, the card-type LED illumination source is supplied with electrical power from the connector and has the back surface of the substrate thereof contact thermally with the receiving portion.

In another preferred embodiment, the illumination apparatus includes a movable mechanism with a fixing portion for fixing the card-type LED illumination source onto the receiving portion. When fixed on the receiving portion, the card-type LED illumination source is supplied with electrical power from the connector and has the back surface of the substrate thereof contact thermally with the receiving portion.

In another preferred embodiment, a thermal resistance between the back surface of the substrate of the card-type LED illumination source, on which none of the LEDs is mounted, and the LEDs is 10° C./W or less.

In another preferred embodiment, the illumination apparatus includes means for dissipating heat from the back surface of the substrate on which none of the LEDs is mounted.

A card-type LED illumination source according to the present invention includes: a metal base substrate; and multiple LED bare chips that have been mounted on one surface of the metal base substrate. The card-type LED illumination source is supported so as to be insertable into, and removable from, an illumination apparatus that includes a connector and a lighting drive circuit. The back surface of the metal base substrate, on which none of the LED bare chips is mounted, thermally contacts with a portion of the illumination apparatus. A feeder terminal is provided on the surface of the metal base substrate on which the LED bare chips have been mounted.

In a preferred embodiment, an optical reflector with holes to surround the LED bare chips is provided on the surface of the metal base substrate on which the LED bare chips have been mounted, and the LED bare chips are encapsulated.

In another preferred embodiment, optical lenses are fitted with the holes of the optical reflector.

In another preferred embodiment, stress relaxing means is provided between the metal base substrate and the optical reflector.

In another preferred embodiment, the center of the metal base substrate is shifted from the center a light outgoing region of the metal base substrate in which the LED bare chips mounted are located.

In another preferred embodiment, a thermal resistance between the back surface of the metal base substrate, on which none of the LED bare chips is mounted, and the LED bare chips is 10° C./W or less.

In another preferred embodiment, an insulating layer and a conductive line pattern are provided on the surface of the metal base substrate so that the LED bare chips are mounted thereon. The insulating layer is made of a composite material including at least an inorganic filler and a resin composition.

In another preferred embodiment, the insulating layer is white.

In another preferred embodiment, the illumination source includes at least two conductive line pattern layers that are stacked one upon the other with an insulating layer interposed between them. The illumination source has a structure for conductive lineing the at least two conductive line pattern layers together at a predetermined position of the insulating layer.

In another preferred embodiment, at least some of the LED bare chips are flip-chip bonded to the conductive line pattern on the metal base substrate.

In another preferred embodiment, a phosphor, which receives at least some of the light that has been emitted from the LED bare chips and which emits visible radiation, is provided on the metal base substrate.

An apparatus according to the present invention includes a connector that supplies electrical power to the card-type LED illumination source according to any of the preferred embodiments described above.

Another card-type LED illumination source according to the present invention includes multiple LED bare chips on a heat-dissipating substrate. Each of the LED bare chips includes a light emitting portion on a chip substrate. The LED bare chips are provided on the heat-dissipating substrate such that a distance between the light emitting portion and the heat-dissipating substrate is shorter than a distance between the chip substrate and the heat-dissipating substrate. A light outgoing facet of the chip substrate of the LED bare chip defines a slope such that a peripheral portion thereof is less tall than a center portion thereof.

In a preferred embodiment, the LED bare chips are directly flip-chip bonded to the heat-dissipating substrate.

In another preferred embodiment, the heat-dissipating substrate is a composite substrate.

In another preferred embodiment, an optical reflector is provided on the heat-dissipating substrate so as to surround each of the LED bare chips and to control the direction of the light that has been emitted from the LED bare chip.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 2(a) is a partial cross-sectional view of an LED in the LED illumination source shown in FIG. 1(a) and FIG. 2(b) is a partial cross-sectional view of an LED in the LED illumination source shown in FIG. 1(b).

FIG. 19(a) is a plan view showing a conductive line pattern of a portion to be flip-chip (FC) bonded, FIG. 19(b) is a plan view showing a conductive line pattern of a portion to be wire bonded (WB bonded), FIG. 19(c) is a cross-sectional view of an FC-bonded LED bare chip, and FIG. 19(d) is a cross-sectional view of a WB-bonded LED bare chip.

DETAILED DESCRIPTION OF THE INVENTION

Figure 1B:
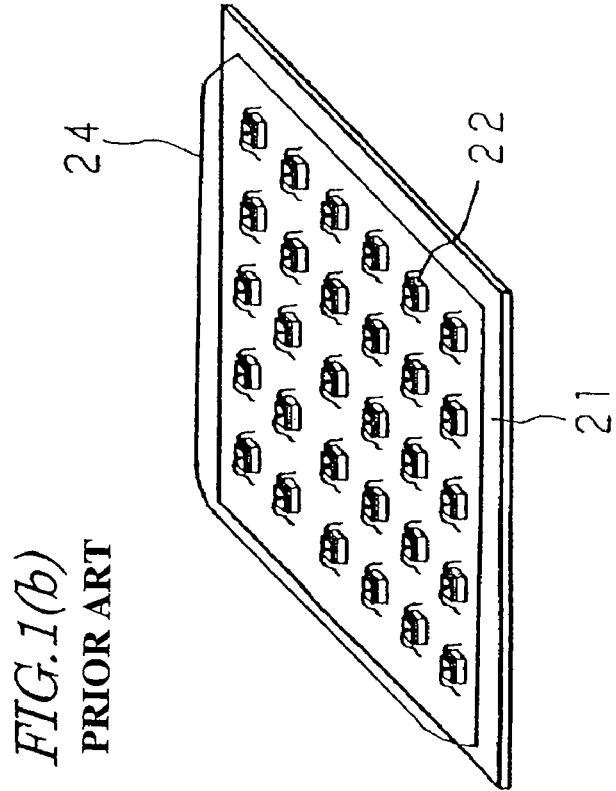
FIG. 1(a) is a perspective view of a conventional LED illumination source and FIG. 1(b) is a perspective view of another conventional LED illumination source.

An LED illumination apparatus according to the present invention includes: a connector to be electrically connected to an insertable and removable card-type LED illumination source; and a lighting drive circuit to be electrically connected to the card-type LED illumination source by way of the connector. When the card-type LED illumination source is fitted in, the apparatus can radiate illumination. As will be described in detail later, the card-type LED illumination source has a structure in which multiple LEDs are mounted on one surface of a substrate (printed circuit board) with good heat dissipation performance.

As already described for the conventional LED illumination sources, if a great number of LED elements are mounted on a substrate at a high density and if a large amount of current is supplied to each of those LED elements, then the LED might generate an excessive quantity of heat to shorten the life of the LED potentially. This is a major problem that constituted a serious obstacle to popularizing LED illumination apparatuses.

According to the present invention, the light source of an illumination apparatus is implemented as an insertable and removable card-type structure, thereby dissipating the heat, generated from the LEDs, much more smoothly. In addition, only a light source with its life ended can be replaced with a brand-new light source. Thus, the overall structure of the LED illumination apparatus, other than the light source, can be used for a long time.

To improve the heat dissipation performance, an LED is preferably mounted as a bare chip on one surface of a substrate. This is because the heat generated from the LED is directly transmitted to the substrate and therefore the substrate can exhibit improved heat dissipation performance in that case.

By integrating the LEDs and feeder terminals together on one surface, or the principal surface, of the substrate, the other surface (i.e., back surface) thereof, which is opposed to the principal surface, can be fully used as a heat-conducting plane for heat dissipation purposes. As a result, the area of contact between this LED illumination apparatus and a thermal conductor member can be at least equal to, or even greater than, the area of a light outgoing region in which the LEDs are mounted. To increase the heat conduction, the back surface of the substrate, on which no LEDs are mounted, is preferably made of a metal.

If the sizes of the card-type LED illumination source and the positions of the feeder terminals are standardized, then the card-type LED illumination source can be used in various types of illumination apparatuses, and can be mass-produced at a reduced cost.

To ensure good electrical insulation between the feeder terminals and to strike an adequate balance between the electrodes and other units to be assembled together, the pitch of the feeder terminals may be defined to be 0.3 mm, 0.5 mm, 0.8 mm, 1.25 mm, 1.27 mm, 1.5 mm or 2.54 mm. Substrates for the card-type LED illumination sources are preferably mass-produced by dicing a wafer of a huge size into a great number of substrates for card-type LED illumination sources. However, the dicing process cannot be free from manufacturing errors. In the LED illumination apparatus, the size of the connector, into/from which the card-type LED illumination source is inserted and removed, is also slightly variable during its mechanical manufacturing process. Accordingly, if the pitch between the electrodes is too small, then the feeder terminals might be short-circuited together in the connector portion of the LED illumination apparatus. For that reason, the pitch between the electrodes is preferably defined to be at least 0.8 mm.

Also, the forward voltage decreases in an LED at an elevated temperature. Accordingly, to increase the stability of its operation, the LED is preferably driven with a constant current supplied rather than a constant voltage applied. When driven with a constant current supplied, then the card-type LED light source needs the same number of ground lines as that of constant-current driving paths. Preferably, multiple grounded feeder terminals are provided on the substrate so as to be electrically isolated from each other. Thus, the LED illumination apparatus to be compatible with such a card-type LED illumination source is also preferably provided with multiple grounded electrode connectors. When a number of feeder terminals are arranged on the card-type LED light source, the pitch between the electrodes is preferably 2 mm or less, more preferably 1.25 mm or less.

If illumination is provided by using the card-type LED light source and LED illumination apparatus of the present invention and by getting blue, green (or cyan), yellow (or orange), red and white LEDs driven independently as will be described later, two electrodes are preferably provided for LEDs of each color (i.e., ten electrodes in total).

The card-type LED light source of the present invention may be designed in such a manner as to be driven either with a constant voltage applied or a constant current supplied. Alternatively, the light source may also be designed to be driven by way of multiple electrically isolated paths. In any case, the card-type LED light source preferably includes two or more conductive line pattern layers, which are stacked one upon the other with an insulating layer interposed between them, and preferably has a structure to interconnect the two or more conductive line pattern layers together.

Where a via structure is adopted as the structure for interconnecting the two or more conductive line pattern layers together, the diameter of via holes may be arbitrarily selected from the range of 100 µm to 350 µm, for example. Considering a possible variation in the diameter of via holes to be provided, the width of the feeder terminals of the card-type LED light source is preferably two or three times as large as the diameter of the via holes, and may be 200 µm to 1,050 µm, for example.

The length of the feeder terminals is preferably defined such that the connector of the LED illumination apparatus does not directly contact with the via metals. For that reason, the feeder terminals preferably have a length of 1 mm or more, for example. To downsize the card-type LED light source, however, the length of the feeder terminals is preferably no greater than 5 mm.

Hereinafter, preferred embodiments of an LED illumination apparatus according to the present invention will be described first with reference to the accompanying drawings.

EMBODIMENT 1

Figure 3A:
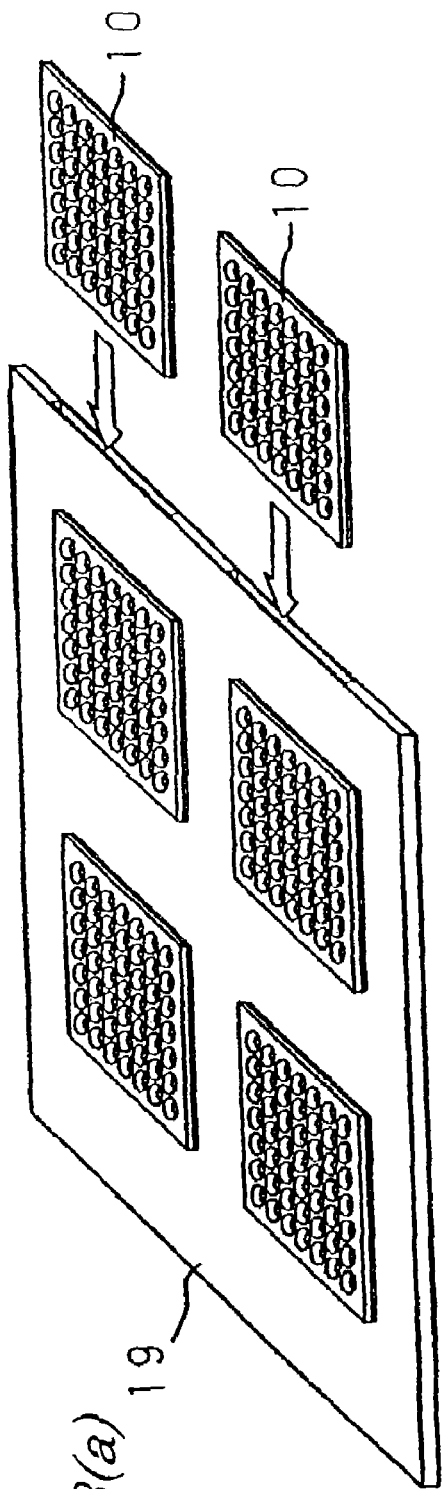
FIG. 3(a) is a perspective view illustrating a portion of a planar LED illumination apparatus according to the present invention and FIG. 3(b) is a perspective view illustrating a light bulb type LED illumination apparatus according to the present invention.

FIG. 3(a) is a perspective view illustrating a portion of an LED illumination apparatus according to the present invention and shows a heat sink 19 in which multiple insertable/removable card-type LED illumination sources 10 are fitted.

Each of the card-type LED illumination sources 10 is inserted to a predetermined position through a slot, which is provided on a side surface of the heat sink 19. The heat sink 19 thermally contacts with the back surface of the card-type LED illumination source 10 inserted, thereby dissipating the heat away from the back surface of the substrate of the card-type LED illumination source 10.

When inserted in the heat sink 19, the card-type LED illumination sources 10 are electrically connected to a connector (not shown), which is provided inside the heat sink 19. The card-type LED illumination sources 10 are further connected electrically to a lighting drive circuit (not shown) by way of the connector. As used herein, the "connector" refers to any of various types of members or components that can be electrically connected to the card-type LED illumination source through an insertable/removable mechanism. Connectors with various structures, to/from which numerous types of memory cards, for example, are inserted or removed, are on the market. According to the present invention, a connector that has substantially the same structure as any of those currently available connectors may be adopted.

An LED illumination apparatus, including such a heat sink 19 and a lighting drive circuit, can easily have a reduced thickness and can be used effectively as a planar light source. Also, if any of the card-type LED illumination sources 10 gets out of order, the non-operating card-type LED illumination source 10 may be removed from the heat sink 19 and instead a new (i.e., normally operating or non-deteriorated) card-type LED illumination source 10 may be inserted. Then, the illumination apparatus can be used continuously.

In a preferred embodiment of the present invention, the feeder terminals are provided on the surface of the card-type LED illumination source 10 such that the card-type LED illumination source 10 can be easily inserted or removed without using any special tool or instrument. Thus, just by connecting the card-type LED illumination source 10 to the connector, the feeder terminals can be electrically contacted with, and connected to, the connector. Specific preferred structures of such a card-type LED illumination source 10 will be described in detail later.

Figure 3B:
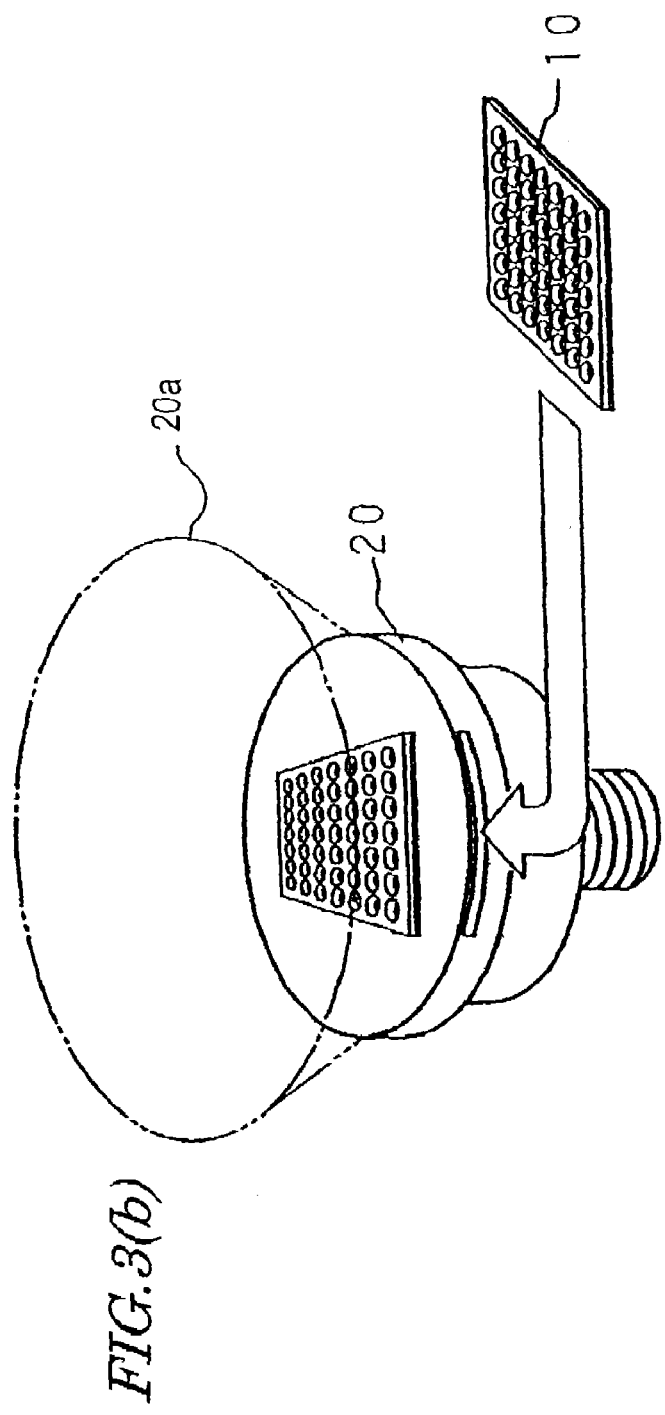

As described above, in the embodiment illustrated in FIG. 3(*a*), the heat sink 19 thermally contacts with the back surface of the substrate of the card-type LED illumination source 10 (i.e., the surface on which no LEDs are mounted). Accordingly, this heat sink 19 functions as a thermal conductor member to receive the heat from the back surface of the substrate of the card-type LED illumination source. Examples of other preferred thermal conductor members include a heat-dissipating sheet made of silicone grease or gel, a combination of such a heat-dissipating sheet and a heat sink, and a combination of a heat pipe and a fan. Optionally, the casing of the LED illumination apparatus itself may also be used as a thermal conductor member.

Next, FIG. 3(*b*) will be referred to.

The LED illumination apparatus shown in FIG. 3(*b*) is an illumination apparatus that can replace a known incandescent lamp, and includes: an adapter 20 to support the card-type LED illumination source thereon in an insertable/removable state; and a transparent housing 20*a* to cover the card-type LED illumination source inserted. A lighting drive circuit (not shown) is provided inside the adapter 20. The lower portion of the adapter 20 is a feeder base (lamp base for a light bulb) (e.g., a screw base) to externally supply electric energy to the internal lighting drive circuit. The shape and size of this feeder base may be the same as those of the feeder base of a normal incandescent lamp. Accordingly, the LED illumination apparatus shown in FIG. 3(*b*) may be used by being fitted in any currently available electric light socket in which an incandescent lamp may be screwed. It should be noted that the screw base may be replaced with a pin base.

In the LED illumination apparatus shown in FIG. 3(*b*), the adapter 20 includes a slot, through which the card-type LED illumination source 10 is inserted. A connector (not shown) is provided at the end of the slot to electrically connect the card-type LED illumination source 10 to the lighting drive circuit. In the embodiment illustrated in FIG. 3(*b*), the slot is provided for the adapter 20 so as to insert or remove the card-type LED illumination source 10 therethrough. However, the illumination source 10 does not have to be inserted or removed in this manner. Other preferred embodiments of a non-slotted type will be described later.

As described above, the card-type LED illumination source 10 shown in FIG. 3(*b*) has such a structure as allowing the user to insert the illumination source 10 into, or remove it from, the connector easily. Accordingly, the illumination source 10 can also be easily removable from a luminaire. Since the card-type LED illumination source 10 is easily removable in this manner, the following effects can be achieved.

Firstly, a luminaire that emits a different quantity of light can be easily provided by substituting a card-type LED illumination source 10, on which LEDs are mounted at a different density, for the existent one. Secondly, even if any card-type LED illumination source 10 has deteriorated in a shorter time than expected and has almost run out of its life as light source, only the light source section can be renewed just by replacing the exhausted card-type LED illumination source 10 as in a normal light bulb or fluorescent lamp.

Thirdly, each of the LEDs to be mounted on the card-type LED illumination source 10 may emit light in a color having a relatively low correlated color temperature, light in a color having a relatively high correlated color temperature, or light in a unique color such as blue, red, green or yellow, for example. By selecting an appropriate one from these card-type LED illumination sources 10 and inserting it into its associated LED illumination apparatus, the colors of the light to be emitted from the LED illumination apparatus can be switched or controlled.

Furthermore, if LEDs that emit light in multiple colors (i.e., two or more colors) are mounted on the same card-type LED illumination source 10, then the colors of the light emitted from the single card-type LED illumination source 10 can range from a color having a relatively low correlated color temperature to a color having a relatively high correlated color temperature. In that case, if the card-type LED illumination source 10 is a two-wavelength type for emitting light rays in just two colors, then a light source having low color rendering performance but high optical efficiency is realized. For example, if the correlated color temperatures should be low, then red and cyan (or green) emissions are preferably combined with each other. On the other hand, if the correlated color temperatures should be high, then blue and yellow (or orange) emissions are preferably combined with each other. It should be noted that if a phosphor, which is excited by a blue ray and has a peak of emission at an intermediate wavelength between blue and red parts of the visible radiation range (e.g., YAG phosphor), is added to a combination of blue-ray-emitting and red-ray-emitting LEDs, then a high-efficiency light source with a general color rendering index (CRI) of 80 or more is realized. Furthermore, if the card-type LED illumination source 10 is a three-wavelength type for emitting light rays in three colors, then blue, cyan (or green) and red emissions are preferably combined with each other. And if the card-type LED illumination source 10 is a four-wavelength type for emitting light rays in four colors, then blue, cyan (or green), yellow (or orange) and red emissions are preferably combined with each other. The four-wavelength type, in particular, can be a light source with high color rendering performance, which has a general CRI of over 90. It should be noted that the present invention is also applicable for use even if the LED bare chips to be mounted emit single-color or ultraviolet rays or if white light is emitted by getting a fluophor or phosphor excited by the LED bare chips. Alternatively, the fluophor or phosphor may be included in the substrate. Furthermore, even when blue-ray-emitting LEDs, a fluophor or phosphor to be excited by a blue ray, and red-ray-emitting LEDs are combined together, high optical efficiency and high color rendering performance are realized at the same time.

The card-type LED illumination source 10 described above has a square card shape. However, the present invention is in no way limited to this specific preferred embodiment. The electrodes to supply electric energy (i.e., feeder terminals) are preferably provided on the substrate of the card-type LED illumination source 10 around the region in which the LEDs are arranged. In a more preferred embodiment, multiple feeder terminals are arranged beside one end (one side) of the substrate. If a large number of feeder terminals are needed, the substrate may have a rectangular shape with longer sides. In that case, the center of a cluster of LEDs (i.e., the center of the light outgoing region in which the LEDs are arranged) shifts from that of the substrate. Then, no bending stress will be placed on the center of the light outgoing region including an optical system. Thus, the illumination source can resist the bending stress sufficiently. Also, if the corners of the rectangle are rounded, then the LED luminaire is less likely scratched by the corners of the substrate while the user is removing the card-type LED illumination source with fingers.

It should be noted that a portion of the substrate may include a notch, mark, recess or protrusion to indicate the insertion direction of the card-type LED illumination source 10 clearly. Then, in fitting the card-type LED illumination source 10 in the illumination apparatus, the card-type LED illumination source 10 can be positioned accurately and easily with respect to the illumination apparatus.

In the preferred embodiment described above, the feeder terminals are provided on the card-type LED illumination source and are connected to the connector electrodes. However, any of the following alternative configurations may be adopted.

i) A face bonding type cable connector part is mounted on the electrodes of the card-type LED illumination source such that a feeder cable can be inserted or removed into/from the card-type LED illumination source itself, or ii) A feeder cable is directly bonded to the card-type LED light source such that the free end of the cable, which is not bonded to the card-type LED light source, can be inserted or removed into/from the power supply.

When one of these alternative configurations is adopted, the feeder cable is preferably a flat cable with some flexibility.

EMBODIMENT 2

Next, specific preferred embodiments of a card-type LED illumination source according to the present invention will be described.

Figure 4B:
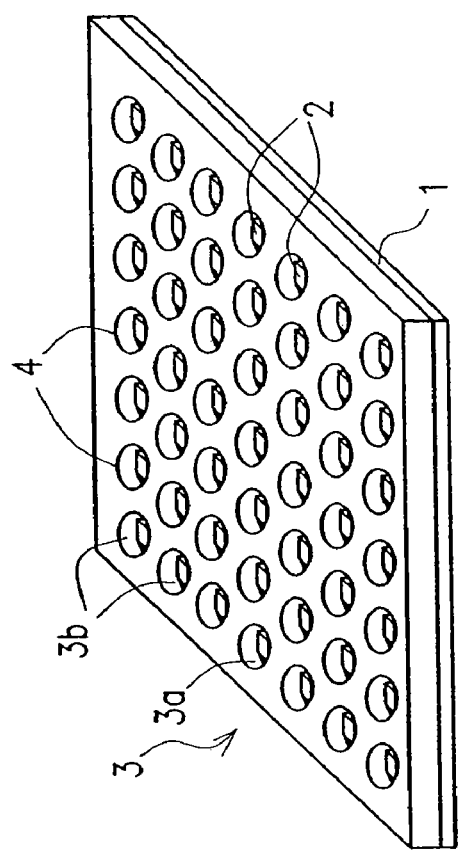
FIG. 4(a) is an exploded perspective view of a card-type LED illumination source according to a specific embodiment of the present invention and FIG. 4(b) is a perspective view of the LED illumination source.
Figure 4A:
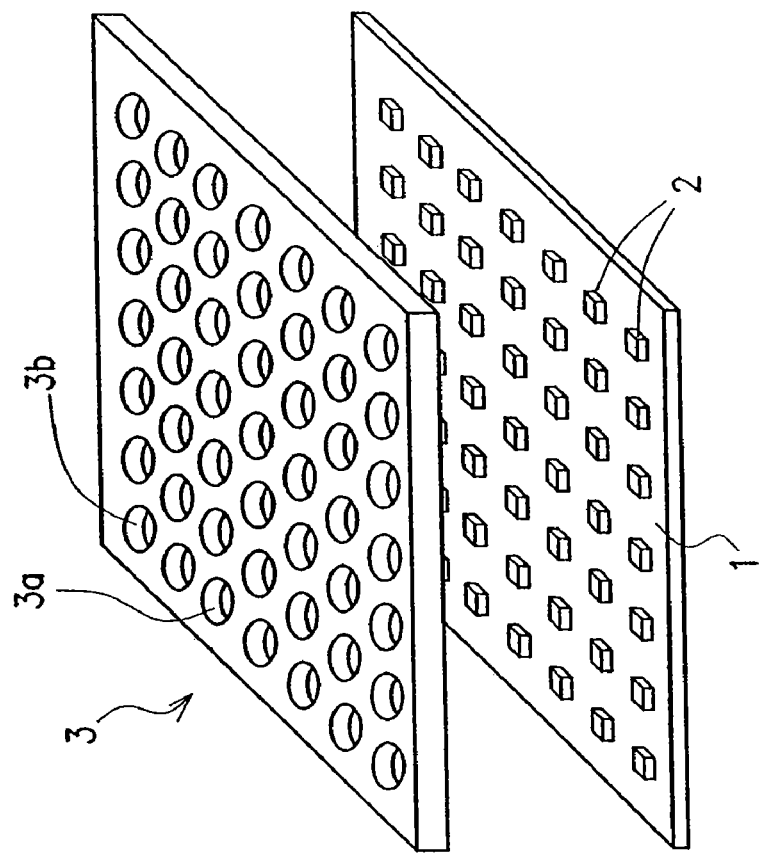

FIGS. 4(a) and 4(b) illustrate a configuration for a card-type LED illumination source according to a second specific embodiment. The card-type LED illumination source of this embodiment is preferably for use in the illumination apparatus shown in FIG. 3(a) or 3(b).

In the card-type LED illumination source of this embodiment, multiple LED bare chips 2 are mounted on one surface of a heat-dissipating substrate 1 as shown in FIG. 4(a). In the example illustrated in FIG. 4(a), the LED bare chips 2 are arranged in matrix, or in columns and rows. However, the present invention is in no way limited to this specific preferred embodiment. Thus, the LED bare chips 2 may be arranged in any other arbitrary pattern.

The heat-dissipating substrate 1 with the LED bare chips 2 mounted thereon is further combined with the optical reflector 3 shown in FIG. 4(a) to make the card-type LED illumination source shown in FIG. 4(b). The optical reflector 3 includes the same number of openings (or holes) 3b as that of the LED bare chips 2 that are arranged on the heat-dissipating substrate 1. Thus, the light that has been emitted from the LED bare chips 2 goes out through the openings 3b of the optical reflector 3. It should be noted that to increase the light-extraction efficiency, the openings (or holes) of the optical reflector preferably have varying diameters such that the light outgoing portion thereof, which is more distant from the heat-dissipating substrate, has a greater diameter than that of their portion closer to the heat-dissipating substrate.

In this embodiment, an alumina composite substrate having a high thermal conductivity of about 3.2 W/(m·K) is used as the heat-dissipating substrate 1 of the card-type LED illumination source. The heat-dissipating substrate 1 of an alumina composite is a metal base substrate including a metal plate as a base with a thickness of 0.5 µm to 3.0 µm, for example, and an insulating layer provided on the metal plate. To ensure a good warpage or bend strength against the heat generated, the substrate preferably has a thickness of at least 0.7 mm. On the other hand, to dice the mother wafer into a number of substrates just as intended, the substrate preferably has a thickness of at most 2.0 mm. Furthermore, to improve the heat dissipation performance thereof, a thermal resistance between the back surface of the substrate of the card-type LED illumination source, on which no LED bare chips are mounted, and the LED bare chips is preferably 10° C./W or less.

Figure 5A:
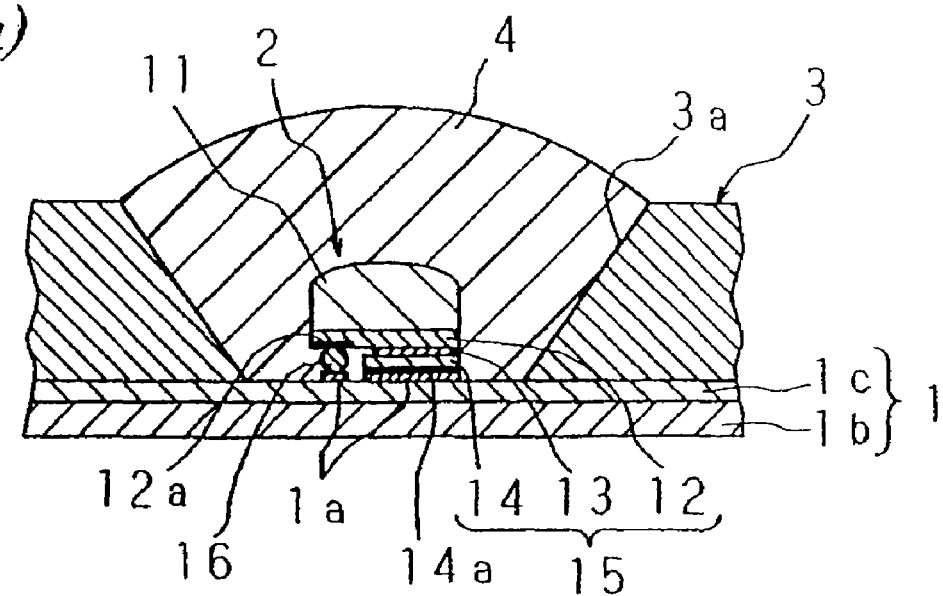
FIGS. 5(a) and 5(b) are cross-sectional views of an LED in card-type LED illumination sources according to two specific embodiments of the present invention.

Next, cross-sectional structures of the card-type LED illumination source will be described in detail with reference to FIGS. 5(a) and 5(b). FIG. 5(a) illustrates a partial cross section of an exemplary illumination source with a single insulating layer 1c. On the other hand, FIG. 5(b) illustrates a partial cross section of another exemplary illumination source with multiple (two in this case) insulating layers 1c and 1e.

Figure 5B:
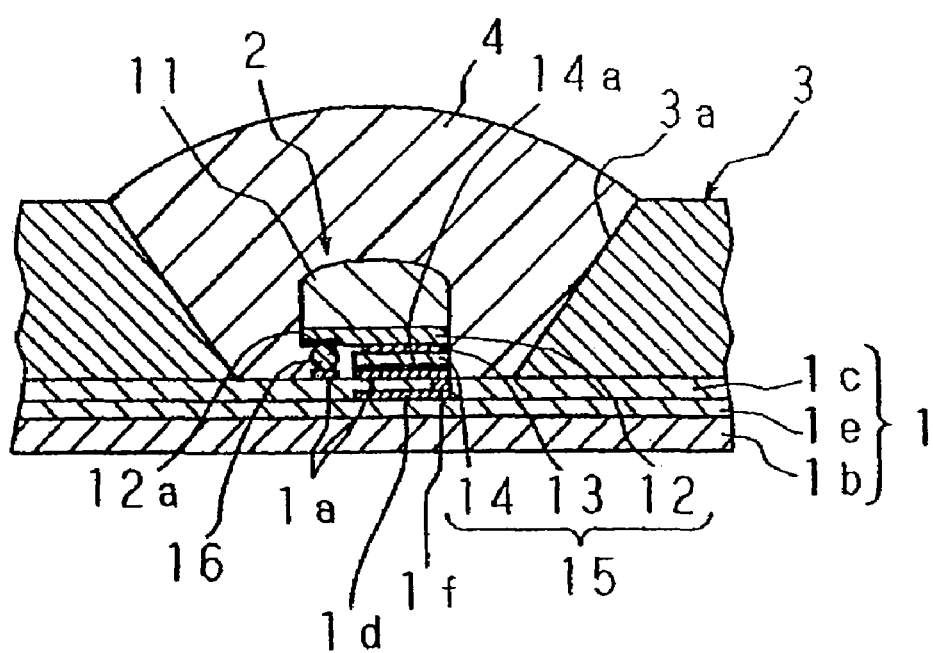

As can be seen from FIGS. 5(a) and 5(b), the heat-dissipating substrate 1 of this embodiment includes a metal plate 1b and insulating layer(s) 1c (and 1e) that has or have been bonded onto the metal plate 1b. The insulating layers 1c and 1e are preferably made of a composite material including an inorganic filler and a resin composition. The total thickness of the two insulating layers 1c and 1e may be 100 µm to 400 µm, for example. FIG. 5(b) illustrates an example in which two insulating layers are provided. However, the number of insulating layers may be further increased.

The inorganic filler is preferably at least one filler that is selected from the group consisting of $Al_2O_3$, MgO, BN, $SiO_2$, SiC, $Si_3N_4$ and AlN. To increase the fill density and the thermal conductivity, particles of the inorganic filler are preferably spherical. The resin composition in which the inorganic filler is dispersed preferably includes at least one resin that is selected from the group consisting of epoxy resin, phenol resin and cyanate resin. Furthermore, the mixture preferably includes 70 wt % to 95 wt % of inorganic filler and 5 wt % to 30 wt % of resin composition.

The metal plate 1b maintains the mechanical strength of the heat-dissipating substrate 1 and contributes to distributing the heat in the heat-dissipating substrate 1 as uniformly as possible. Also, the metal plate 1b has a flat back surface. Accordingly, when the metal plate 1b thermally contacts with a member having good thermal conductivity (e.g., a heat sink not shown), high heat dissipation effects are achieved.

The insulating layer 1e on the metal plate 1b, which is the base metal of the heat-dissipating substrate 1, may have the structure described above. Alternatively, a low-temperature-baked glass-ceramic substrate, having a lower thermal conductivity than the composite material, may also be used instead. Optionally, a ceramic substrate, an enamel substrate, an aluminum nitride substrate or a beryllium oxide substrate, each of which has a high thermal conductivity, may also be used as the base, although these substrates are rather expensive. However, considering its good heat dissipation performance and mechanical strength, it is most preferable to use a metal plate as the base metal of the heat-dissipating substrate 1. The insulating layer to be bonded onto the metal plate may be one of the substrates mentioned above (e.g., a ceramic substrate). In that case, the insulating substrate to be bonded to the metal plate is preferably thin and preferably has a strength high enough to be bonded there. The insulating substrate may have a thickness of 80 μm to 1,000 μm, for example. In this manner, multiple insulating layers, made of different materials or having different compositions, may be stacked on the base metal.

On the heat-dissipating substrate 1, conductive lines 1a (and 1d) are provided and electrically isolated from the metal plate 1b by the insulating layer(s) 1c (and 1e) made of the composite material.

In the example illustrated in FIG. 5(*b*), the conductive lines 1a on the first insulating layer 1c are electrically connected to the conductive lines 1d on the second insulating layer 1e by way of a via metal If that is provided through the first insulating layer 1c.

Figure 6B:
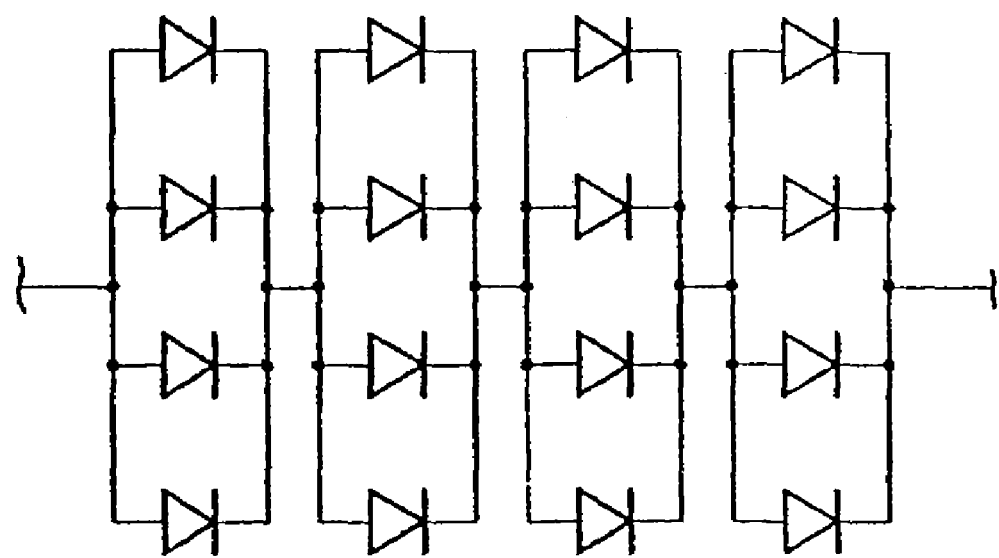
FIGS. 6(a) and 6(b) are equivalent circuit diagrams showing how multiple LEDs of the card-type LED illumination source may be connected together.
Figure 6A:
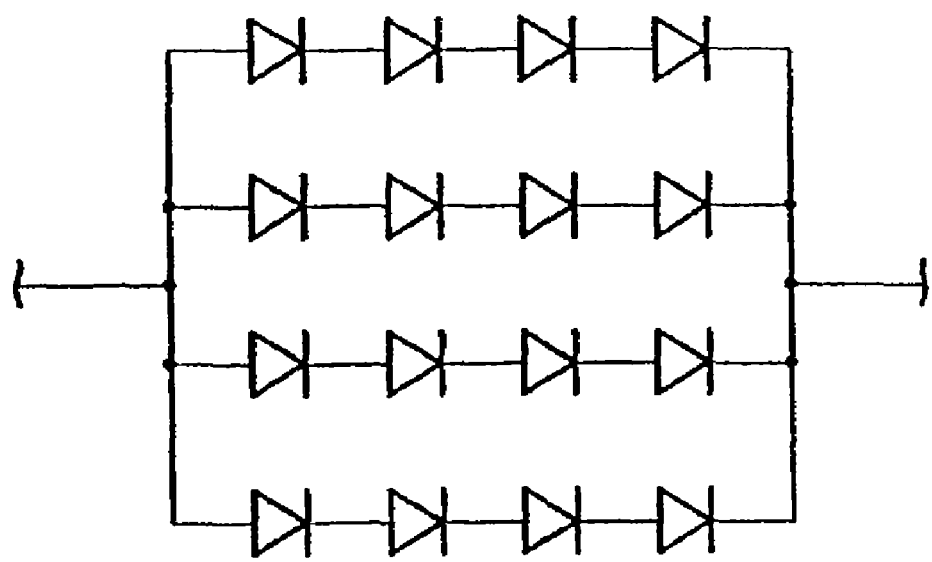
Figure 15:
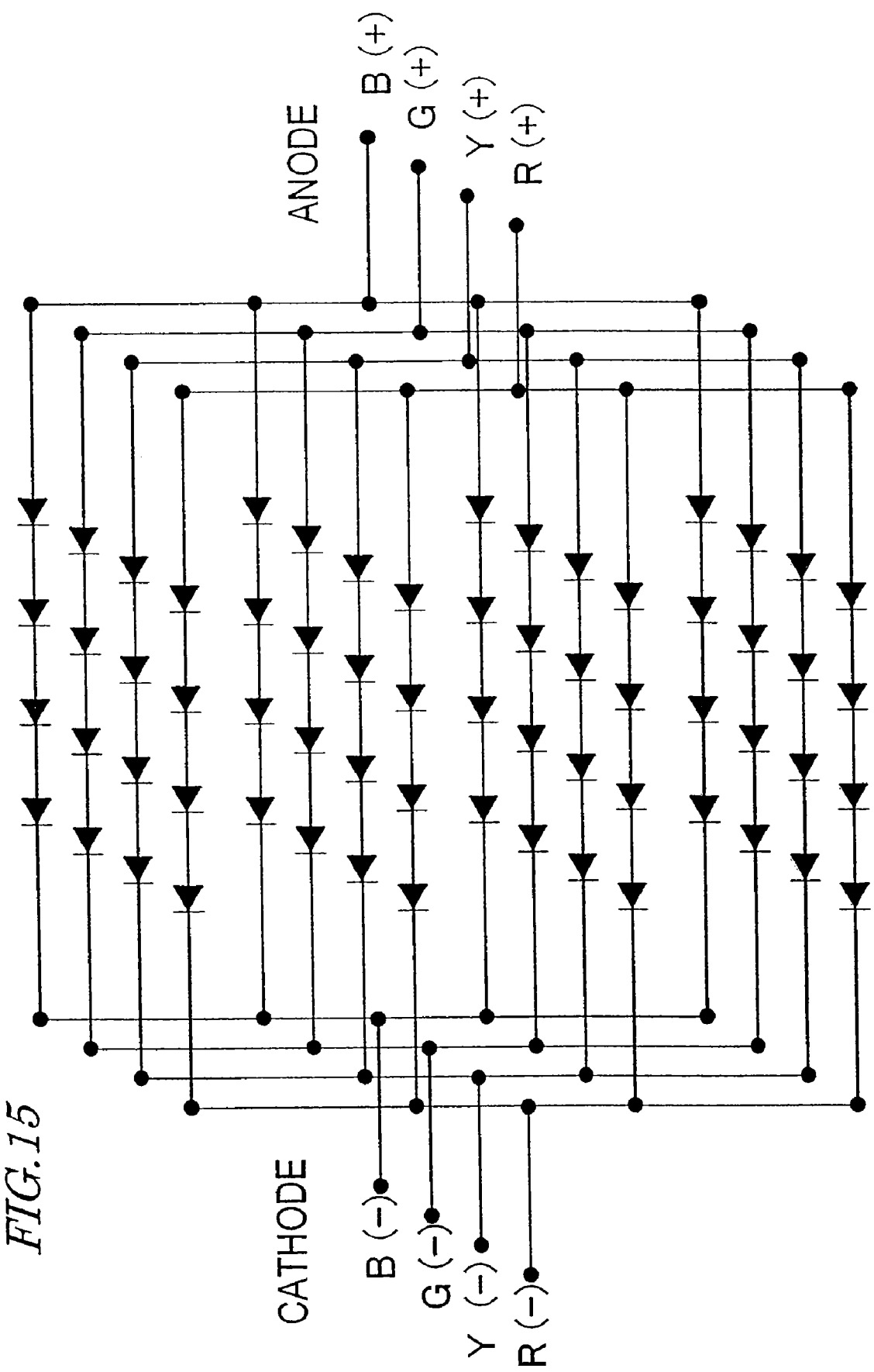
FIG. 15 is an equivalent circuit diagram showing how LEDs may be connected together in the card-type LED illumination source shown in FIG. 12.

As for the heat-dissipating substrate 1 shown in FIG. 5(*a*), when a number of LEDs are arranged on the same substrate to emit light rays in multiple colors (e.g., two to four colors), a simple series-parallel connection as shown in FIG. 6(*a*) or a ladder connection as shown in FIG. 6(*b*) is adopted for each of those colors. By adopting such a ladder connection, the LEDs can be turned ON with the variation in current-voltage characteristic thereof minimized. Also, even if just one LED is disconnected, all of the LEDs that are connected in series to the disconnected LED will be turned OFF in the circuit shown in FIG. 6(*a*). In the circuit shown in FIG. 6(*b*) on the other hand, nothing but the disconnected LED will be turned OFF. In contrast, the heat-dissipating substrate 1 with the multilayer structure shown in FIG. 5(*b*) makes it possible to arrange LEDs of electrically different systems adjacently to each other as shown in FIG. 15. Thus, the presence of OFF-state LEDs or the variation in brightness is even less perceivable in this circuit configuration. In addition, this structure is also advantageous in mixing LED emissions in multiple colors, and makes it possible to adopt the ladder connection.

In this embodiment, an LED 2 in a bare chip state (i.e., LED bare chip) is directly mounted on the heat-dissipating substrate 1. As shown in FIGS. 5(*a*) and 5(*b*), this LED bare chip 2 includes a light emitting portion 15 on a chip substrate 11 of sapphire. The light emitting portion 15 has a structure in which an n-type semiconductor layer 12 of GaN, an active layer 13 and a p-type semiconductor layer 14 are stacked one upon the other.

Figure 1A:
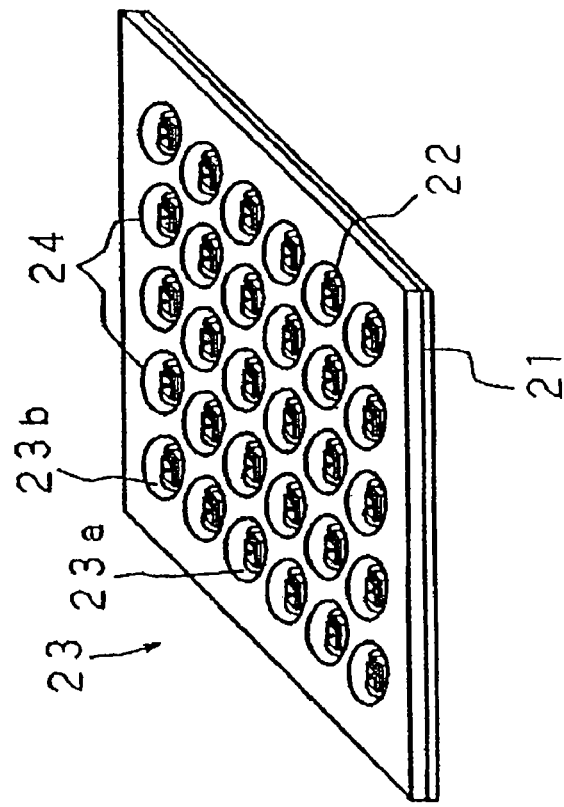

Unlike the conventional examples shown in FIGS. 1(*a*) and 1(*b*), the LED bare chip 2 is mounted facedown in this embodiment, i.e., such that the light emitting portion 15 is closer to the heat-dissipating substrate 1 than the chip substrate 11 is. That is to say, the electrode 14a of the p-type semiconductor layer 14 is directly flip-chip bonded to the conductive line 1a on the heat-dissipating substrate 1. The electrode 12a of the n-type semiconductor layer 12 is also connected to the conductive line 1a on the heat-dissipating substrate 1 by way of a bump 16, not wire. The electrodes 12a and 14a may also be bonded with respective bumps. The greater the area of the electrode 12a or 14a of the LED bare chip 2 to be metal-bonded onto the conductive lines 1a, the greater the quantity of heat dissipated. In view of this consideration, the configuration of this embodiment, in which light is allowed to go out from the chip substrate 11 and a great metal contact area can be provided under the light emitting portion 15, is advantageous.

Considering currently available LED bare chips, a width or length of about 250 μm to about 350 μm and a thickness of about 90 μm to about 350 μm would be practical choices as sizes of each LED bare chip 2. However, the present invention is in no way limited to these specific sizes.

If the LED bare chips 2 are flip-chip bonded to the conductive line pattern and have a width and a length of about 1 mm or more as is done in this embodiment so as to increase the quantity of light that can be extracted from a single LED bare chip 2, then the following advantages are obtained.

When the sizes of an LED bare chip are increased to 500 μm or more, the emission produced might be intense enough near the electrodes but might be weak at a position far away from the electrodes due to the distributions of resistance and current density in the p- and n-type semiconductors that are bonded to the electrodes and fed with electric energy, which is a problem. However, this problem can be resolved by flip-chip bonding an LED bare chip of a large size and increasing the area of the electrodes of the LED bare chip to 50% or more of the overall area of the element as is done in this embodiment. This advantage is achieved by the unique structure of the present invention in which the light outgoing facet of an LED bare chip is opposite to the feeding surface thereof. It should be noted that the electrodes provided for each LED bare chip do not have to consist of just one pair (i.e., those provided for the p- and n-type semiconductor layers in this embodiment) but may consist of multiple pairs. Then, the variation in current density inside the LED bare chip can be reduced. If those multiple pairs of electrodes are connected by the conventional wire bonding technique, then each wire should run a long distance to reach its destination or the wire bonding process needs to be carried out an increased number of times.

In this embodiment, the surface of the chip substrate 11, i.e., the surface of the substrate of the LED bare chip (or the light outgoing facet), is not completely planar but has such a shape as decreasing the height from its raised center portion toward its periphery (e.g., a dome shape).

In the optical reflector 3 of a metal (e.g., aluminum) on the heat-dissipating substrate 1, a reflective plane 3a that controls the direction of the light emitted from each LED bare chip 2 is provided so as to surround the LED bare chip 2 and the hole 3b is provided for each LED bare chip 2. Also, this hole 3b is filled with a resin 4 (e.g., epoxy, resin, silicone, or a combination thereof) to mold the LED bare chip 2 with. This molding resin 4 works as a lens.

In such a structure, when a forward bias voltage is applied between the electrodes 12a and 14a, the electrons injected into the n-type semiconductor layer 12 will recombine with the holes injected into the p-type semiconductor layer 14, thereby emitting light from the active layer 13. And this emission is utilized as illumination. Also, the light that has been emitted laterally in FIGS. 5(*a*) and 5(*b*) gets reflected upward by the reflective plane 3a of the optical reflector 3, thereby increasing the optical efficiency.

In this embodiment, when each LED bare chip 2 emits the light, a huge quantity of heat is also generated. However, the heat generated is directly dissipated from the light emitting portion 15 into the heat-dissipating substrate 1. At the same time, the metallic optical reflector 3 also contributes to distributing the heat uniformly in the heat-dissipating substrate 1, thereby preventing the heat from being concentrated at the center of the heat-dissipating substrate 1.

The LED bare chip 2 of this embodiment may be fabricated by the following process steps, for example.

First, an n-type semiconductor layer of GaN, an active layer, and a p-type semiconductor layer of GaN are deposited and stacked in this order on a sapphire wafer with a diameter of about 2 inches by a CVD process, for example, and then electrodes 12a and 14a are formed thereon to prepare a semiconductor wafer. Next, the semiconductor wafer prepared in this manner is subjected to sand blasting and dicing process steps, thereby making a number of LED bare chips 2.

Specifically, fine ceramic or metal particles are propelled against the sapphire side of the semiconductor wafer, thereby forming multiple isolating grooves on the sapphire side of the wafer. Thereafter, those isolating grooves are further deepened by the dicing process, thereby cutting the wafer into multiple LED bare chips 2. In this manner, multiple LED bare chips 2, in which the light outgoing facet of the chip substrate 11 is raised like a dome, are obtained. In this case, by adjusting the flow rate or flow velocity of the ceramic or metal particles to be sprayed, the surface shape of the chip substrates 11 can be controlled. Alternatively, two dicing blades with cutting edges in different shapes may be used in combination. In that case, the sloped portions may be formed first by a cutting process that uses a dicing blade with one type of cutting edge and then the wafer may be fully divided into respective chips with a dicing blade having the other type of cutting edge.

Unlike the conventional LED bare chip including electrodes both on the top and bottom thereof, the flip-chip bonding structure is adopted and the upper surface of the LED bare chip is smaller than the lower surface thereof in this embodiment. Accordingly, there is no need to concern about the decrease in size of the upper electrode, or damage possibly done on it, during the machining process described above. Also, since no wires are provided on the upper surface of the LED bare chip, no radiation is interfered with by any wire. Accordingly, the distribution of the emission is not disturbed by, or the optical output power is not decreased by, the wires.

In the example described above, a sapphire wafer is supposed to be used. Alternatively, an SiC wafer, a GaN wafer or any other wafer may also be used. The point is that the wafer to be used should transmit not only visible radiation but also any other radiation emitted from the LEDs. As another alternative, the LED bare chip may also be packaged with a conventional through hole element (such as a bullet type element), a surface mount (SM) device or a chip type element.

Those LED bare chips 2 prepared in this manner are arranged in matrix on the heat-dissipating substrate 1 with the electrodes 12a and 14a thereof connected to the conductive lines 1a on the heat-dissipating substrate 1. Next, the substrate 1 is covered with the optical reflector 3 and then the respective LED bare chips 2 are molded with the resin 4. It should be noted that the holes 3b of the optical reflector 3 may be filled with the resin 4 by a printing technique. In that case, a great number of resin lenses can be formed at the same time, i.e., mass-produced effectively.

In the card-type LED illumination source of the present invention, the LED bare chips 2 are arranged with the light emitting portion 15 thereof facing the heat-dissipating substrate 1. Accordingly, unlike the conventional examples shown in FIGS. 1(a) and 1(b), no feeding wires or no wire bonding areas are needed. Thus, the space to be provided between adjacent LED bare chips 2 can be narrowed, and therefore, a greater number of LED bare chips 2 can be integrated together. This arrangement is also effectively applicable for use to realize a color mixture by using multiple LED bare chips 2 (or bare chips) that emit light rays in mutually different colors.

In addition, the heat generated by the light emitting portion 15 is efficiently dissipated away through the heat-dissipating substrate 1 with a high thermal conductivity. In this case, the heat-generating, light emitting portion 15 of each LED bare chip 2 is directly bonded to the heat-dissipating substrate 1. Accordingly, unlike the conventional examples shown in FIGS. 1(a) and 1(b) in which the heat is dissipated by way of the chip substrate, the heat generated by the light emitting portion 15 is directly dissipated away through the heat-dissipating substrate 1. Thus, excellent heat dissipation performance is ensured. Accordingly, even if a huge quantity of heat has been generated, the heat can be easily dissipated away and the unwanted increase in temperature of the LED bare chips 2 can be minimized. As a result, a strong current can be supplied to each LED bare chip 2 and a great luminous flux can be obtained.

The refractive index of the chip substrate 11 (made of sapphire) of the LED bare chips 2 is different from that of the resin 4 (such as epoxy or silicone resin). Due to this difference in refractive index, a portion of the light that has been emitted from the light emitting portion 15 is totally reflected from the light outgoing facet of the chip substrate 11. The totally reflected light is directed toward the LED bare chip 2 and cannot be used for illumination purposes. Accordingly, to utilize the produced light effectively, it is necessary to minimize this total reflection.

Figure 7A:
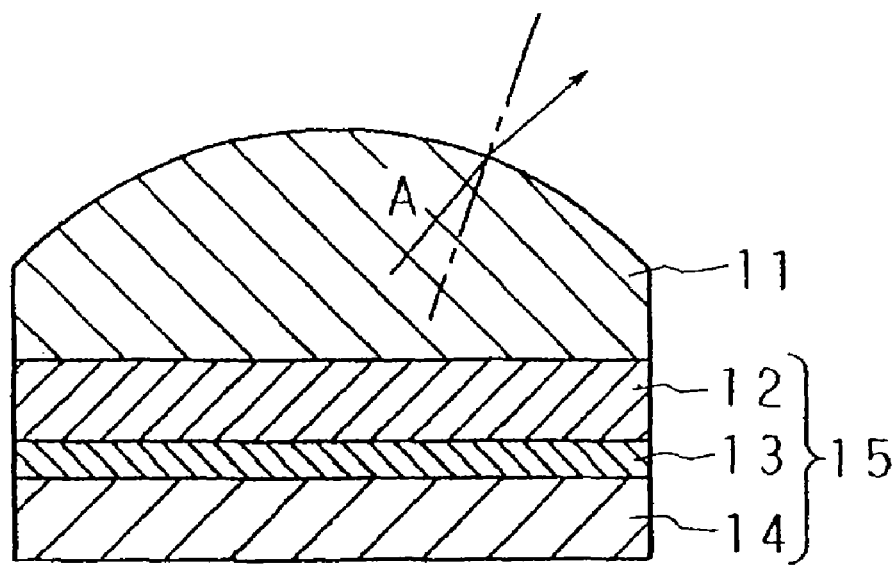
FIGS. 7(a) and 7(b) show to which directions light rays emitted from LEDs go.
Figure 7B:
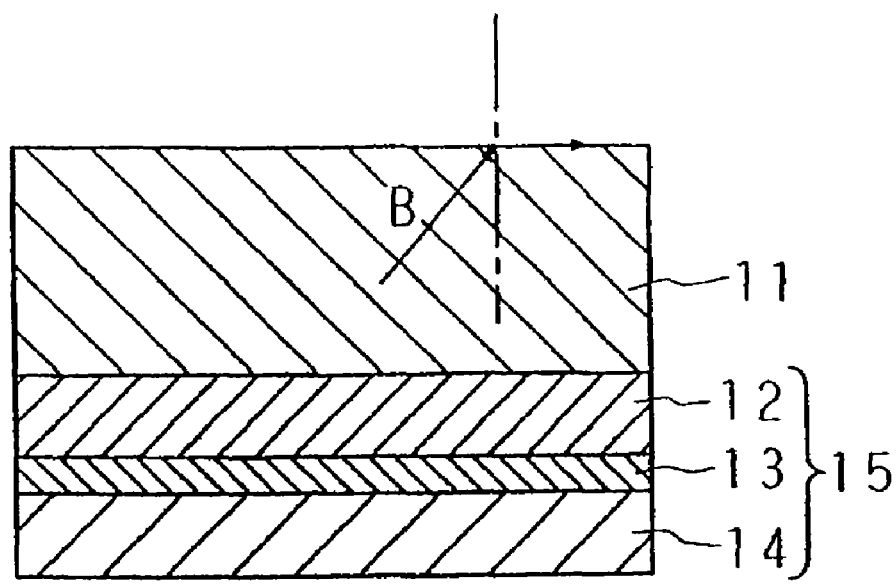

In this embodiment, the light outgoing facet of the chip substrate 11 of each LED bare chip 2 is molded into a dome shape, not parallel to the emission plane. In this manner, the percentage of the totally reflected light to the overall emission from the light emitting portion 15 is decreased. FIG. 7(a) shows to which direction the light goes from the LED bare chip of the present invention with a domed light outgoing facet. FIG. 7(b) shows to which direction the light goes from a comparative example with a horizontal light outgoing facet.

Specifically, if the light outgoing facet is a horizontal plane, the light impinging onto the periphery has a large angle of incidence. Accordingly, an increased percentage of the light has an angle of incidence that reaches a critical angle (as indicated by B in FIG. 7(b)). As a result, the total reflection easily happens. In contrast, if the light outgoing facet is domed, a decreased percentage of the light has an angle of incidence that reaches the critical angle even around the periphery of the light outgoing facet. Consequently, most of the emission from the light emitting portion 15 is not totally reflected but radiated away as indicated by A in FIG. 7(a).

Figure 8B:
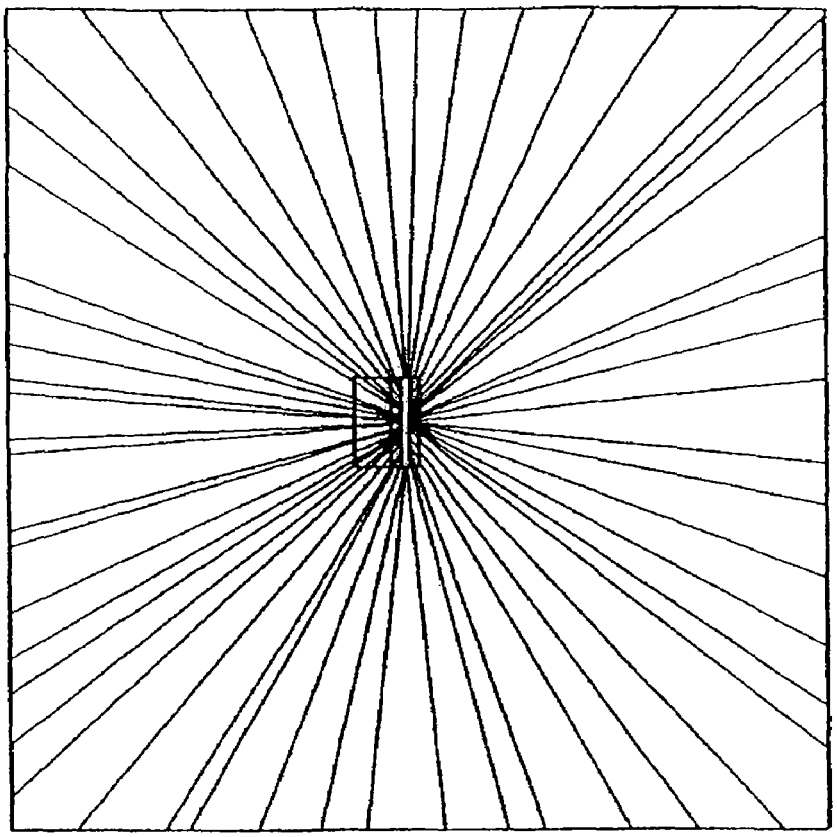
FIGS. 8(a) and 8(b) show the results of simulations on the luminous fluxes of two types of LEDs.
Figure 8A:
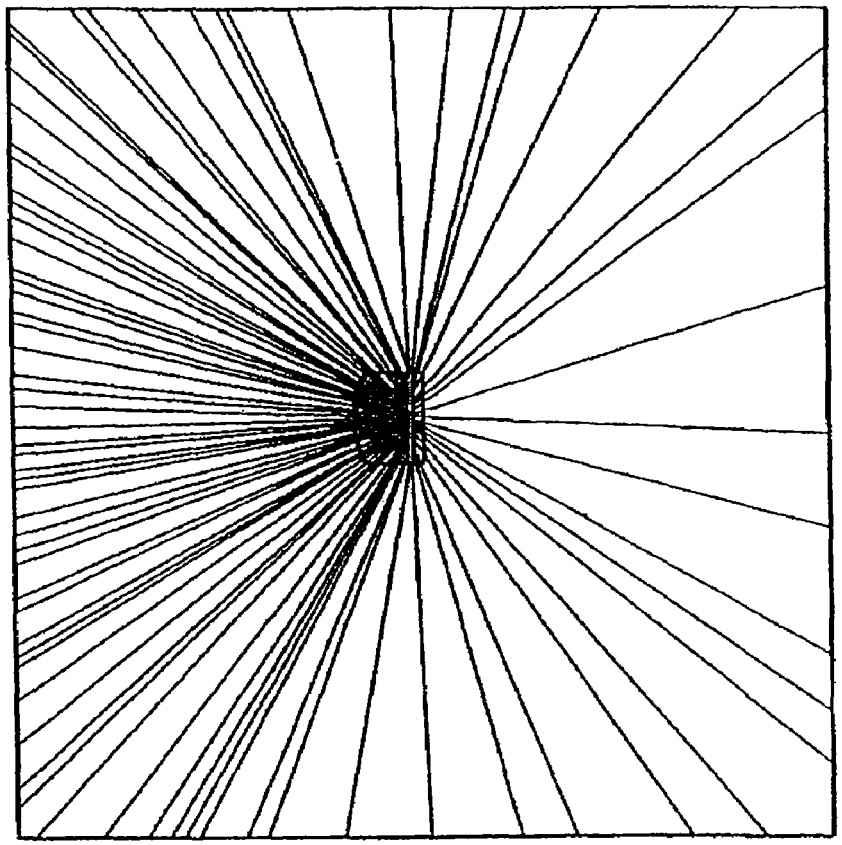

FIGS. 8(a) and 8(b) show respective results of simulations on the luminous flux of the emission of an LED bare chip 2 in which the light outgoing facet of the chip substrate 11 was molded into a dome shape (i.e., an example of the present invention) and on the luminous flux of the emission of an LED bare chip 2 in which the light outgoing facet of the chip substrate 11 was a horizontal plane (i.e., a comparative example). Comparing the results shown in FIGS. 8(a) and 8(b), it can be seen that the luminous flux of the upwardly directed emission, available for use as illumination, was greater in the example of the present invention than in the comparative example. That is to say, the light could be extracted more efficiently in the example of the present invention. The present inventors confirmed via actual measurements that the light-extraction efficiency of the example of the present invention was 1.6 times as high as that of the comparative example.

As described above, in the card-type LED illumination source of the present invention, the light outgoing facet of the chip substrate 11 is domed. Thus, the emission can be extracted non-wastefully and can be utilized as illumination very efficiently.

Figure 9A:
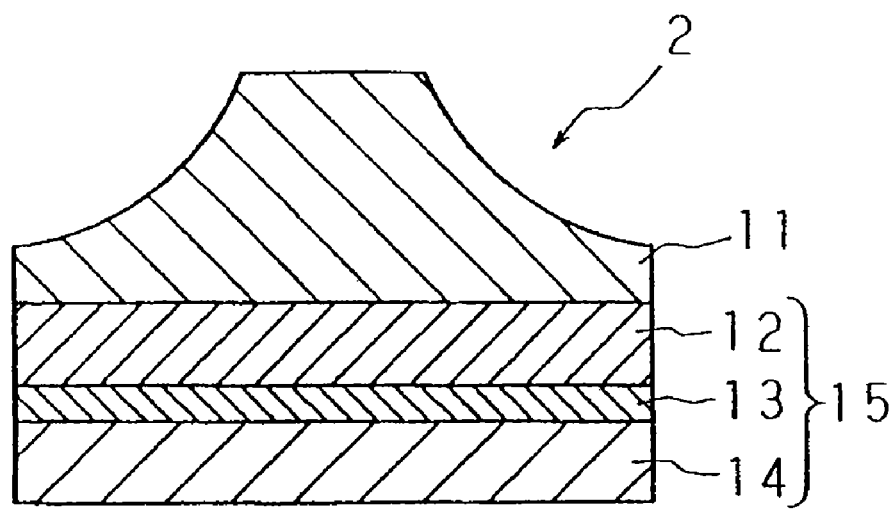
FIGS. 9(a) and 9(b) are cross-sectional views showing other exemplary shapes of the light outgoing facet of the chip substrate of LEDs.
Figure 9B:
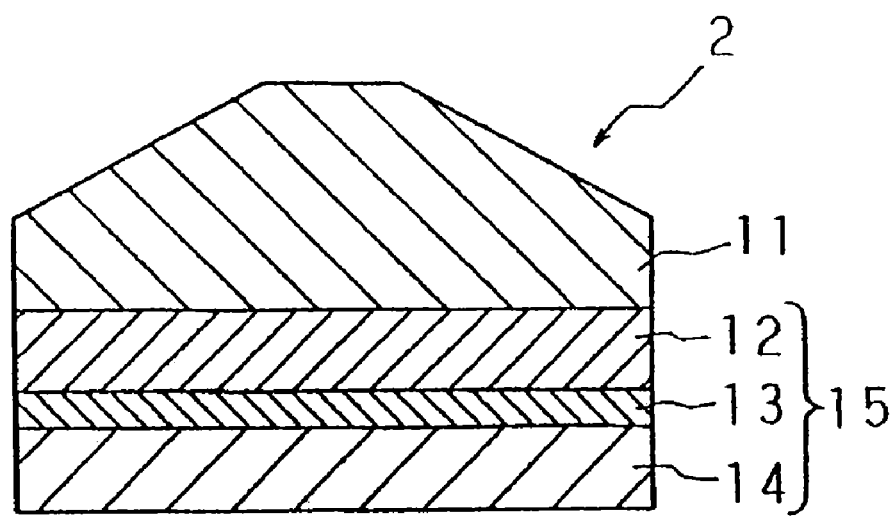

In the example described above, the light outgoing facet of the chip substrate 11 is domed. Alternatively, the facet may have any arbitrary shape as long as the shape can minimize the total reflection (i.e., a facet which is sloped downward from the raised center portion toward the periphery). For example, either the shape shown in FIG. 9(*a*), in which curved surfaces are formed so as to increase its width toward the light emitting portion 15 as opposed to the example described above, or the shape shown in FIG. 9(*b*), in which tapered surfaces are formed so as to have a constant tilt angle, may also be adopted.

However, if the sloped surfaces are not curved but planar or polygonal, then this effect diminishes. Accordingly, the sloped surfaces are preferably domed because the effects achieved in that case are as if a lens were included in the LED bare chip 2 itself. When the LED bare chip 2 functions as a lens by itself, the emission of the LED bare chip 2 is concentrated toward the front of the lens while the quantity of light to be emitted through the side surfaces of the LED bare chip 2 decreases. Thus, an optical system including such an LED bare chip 2 should have decreased stray light components. As a result, the optical efficiency of the overall card-type LED illumination source increases.

The above-described example relates to a blue-ray-emitting card-type LED illumination source including the LED bare chips 2, each emitting a blue ray from a structure in which GaN semiconductor layers are stacked on a sapphire substrate. However, the present invention is naturally implementable as a card-type LED illumination source including LED bare chips that emit red rays, LED bare chips that emit green rays, or LED bare chips that emit yellow rays. The present invention is also applicable for use in a white-light-emitting card-type LED illumination source in which these four types of LED elements coexist and which provides either white light or light rays in various colors by controlling the mixture of those light rays in four colors.

Examples of alternative embodiments include blue-ray-emitting and green (or cyan)-ray-emitting LEDs of GaN that have been provided on dissimilar chip substrates of SiC and GaN, for example. In that case, the chip substrates themselves have some electrical conductivity. Accordingly, instead of providing the electrodes for the n- and p-type semiconductor layers 12 and 14 that sandwich the active layer 13 between them as shown in FIGS. 5(*a*) and 5(*b*), the chip substrate itself may function as one of the two electrodes.

Alternatively, where LED bare chips (or elements) of AlInGaP, which radiate yellow (or orange) and red emissions, are used, a GaP substrate with a high transmittance to the emissions in these colors is preferably used as the chip substrate. Then, the same structure may be adopted as well.

A similar structure may also be used if the light emitting portion of an LED bare chip of AlInGaP is wafer-bonded to a sapphire substrate with a transparent electrode or a transparent substrate of glass, for example.

Figure 10:
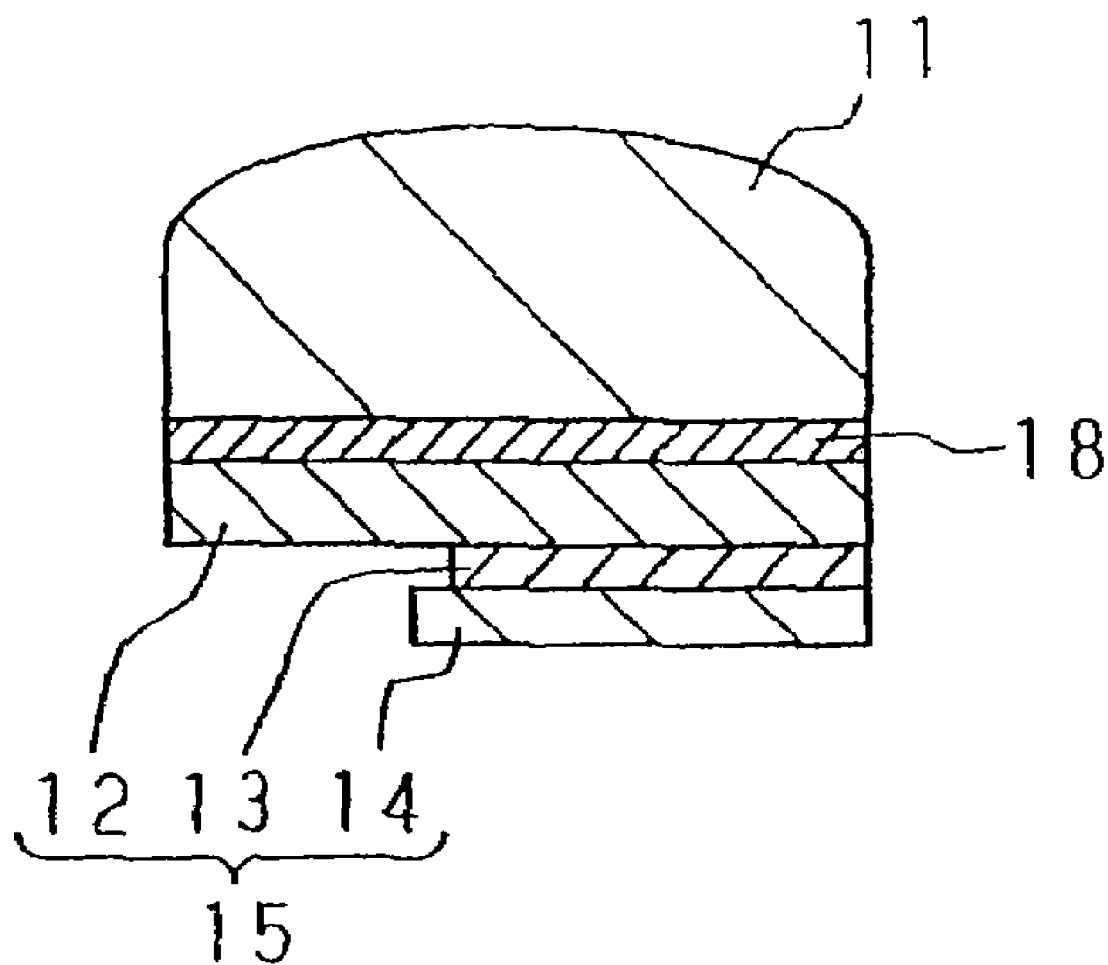
FIG. 10 is a cross-sectional view illustrating another exemplary configuration for an LED.
Figure 11D:
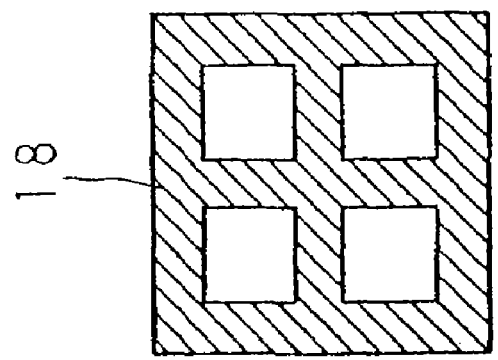
FIGS. 11(a) through 11(d) are planar layouts showing exemplary shapes of a wafer bonding portion of the LED shown in FIG. 10.
Figure 11C:
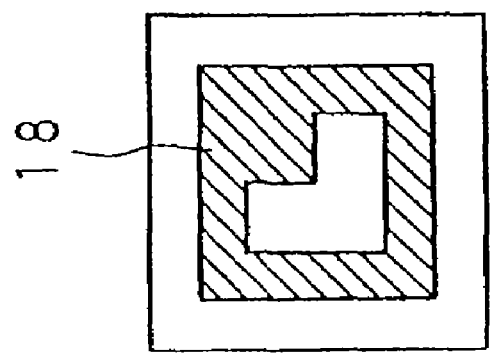
Figure 11B:
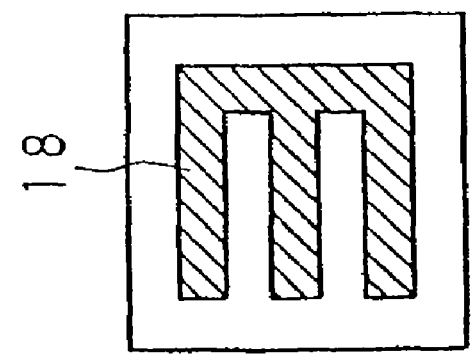
Figure 11A:
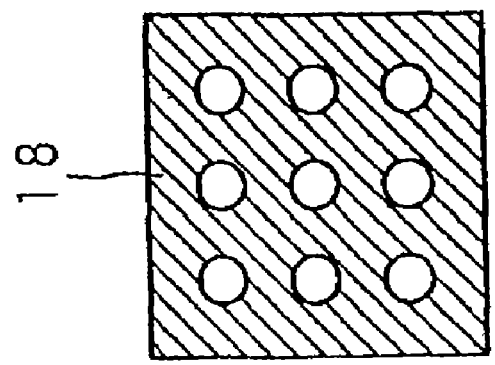

Furthermore, as shown in FIG. 10, a similar structure may be adopted as well even if the light emitting portion 15 of an AlInGaP LED bare chip (element), including a metal electrode with an optical opening, is metal-bonded (e.g., ultrasonic-welded) to a transparent chip substrate 11 such as a sapphire or glass substrate including a metal electrode 18 with an optical opening. In that case, the wafer bonding portion may have any of various planar shapes, some of which are shown in FIGS. 11(*a*) through 11(*d*).

As for the AlInGaP LED bare chip, the metal electrode with openings on the bare chip may be metal-bonded (or wafer-bonded) to the metal electrode with openings on the transparent chip substrate 11 before the growth substrate is removed from the bare chip. In that case, the process step of removing the growth substrate from the LED bare chip is carried out after the metal bonding process step has been performed. The chip substrate 11 may be shaped either before or after the wafer bonding process step and either before or after the process step of removing the growth substrate from the LED bare chip.

Optionally, the transparent substrate may also be wafer-bonded to the light emitting portion of the LED bare chip even with an optically transparent adhesive means.

In the example described above, the surface shape of the chip substrate 11 is defined by the sand blasting process. Alternatively, the surface shape may also be defined either by a water jet process or a selective chemical etching process. As another alternative, optical lenses having a refractive index that is approximately equal to that of the LED chip substrate 11 may be bonded together. Also, as already described for the process step of obtaining the GaN LED bare chips by machining, the surface shape of the chip substrate 11 may also be defined by a cutting process that uses dicing blades with different cutting edges. Optionally, the bare chips to be flip-chip bonded that have been subjected to any of these processes may be included in conventional elements such as bullet type elements or SMDs.

The above-described structure needs no wire bonding process, and therefore, contributes to reducing the size of the optical system and increasing the efficiency thereof.

Even when AlInGaP LEDs are used, the area of the LED electrode, which is located closer to the heat-dissipating substrate to mount the LED bare chip thereon, is preferably increased. Then, the light directed toward the mounting substrate can be reflected back and the light-extraction efficiency can be increased.

It should be noted that the heat-dissipating substrate 1 does not have to be the metal base substrate such as that shown in FIG. 5(*a*) or 5(*b*) but may be a metal core substrate, for example. However, when the heat-dissipating substrate 1 is a metal base substrate, the lower surface of the substrate is a metal and a metallic optical reflector may be disposed on the substrate. Accordingly, the heat can be dissipated more effectively from both the upper and lower surfaces of the substrate.

EMBODIMENT 3

Next, another specific embodiment of a card-type LED illumination source according to the present invention will be described.

First, a card-type LED illumination source according to this embodiment will be described with reference to FIG. 12.

Figure 12:
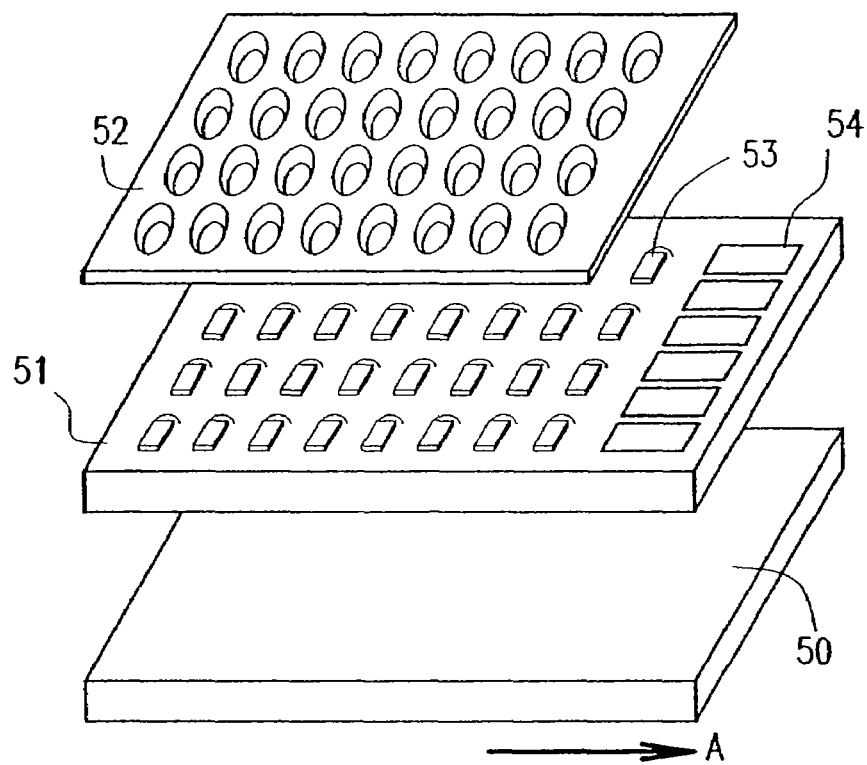
FIG. 12 is an exploded perspective view illustrating another embodiment of a card-type LED illumination source according to the present invention.

As shown in FIG. 12, the card-type LED illumination source of this embodiment includes a metal plate 50, a multilayer circuit board 51, and a metallic optical reflector 52. The metal plate 50 and the multilayer circuit board 51 together define one "card-type LED illumination source".

The metal plate 50 is the base metal of a heat-dissipating substrate. The metal plate 50 and the optical reflector 52 may be made of aluminum, copper, stainless steel, iron, or an alloy thereof. The materials of the metal plate 50 and optical reflector 52 may be different from each other. Considering the thermal conductivity, copper, aluminum, iron and stainless steel are preferred in this order. On the other hand, in view of the thermal expansion coefficient, stainless steel, iron, copper and aluminum are preferred in this order. An aluminum-based material is preferred because such a material is easy to handle in an anticorrosion process, for example. On the other hand, to minimize the decrease in reliability due to the thermal expansion, a stainless steel based material is preferably used.

The back surface of the metal plate 50 is flat and can contact with a flat surface of a member with a good thermal conductivity (not shown).

If the metal plate 50 is subjected to an insulation treatment such as electrolytic polishing, aluminization processing, electroless plating or electrolytic deposition, even direct contact of the metal plate 50 with the conductive line pattern will not create electrical short-circuit.

It should be noted that at least portions of the surface of the metal plate 50, which should reflect the light that has been radiated from the LED bare chips, are preferably subjected to a process to increase the reflectivity. Examples of such processes to increase the reflectivity include the process of increasing the reflectivity by stacking multiple material layers with different refractive indices and the process of increasing the mirror reflection of the surface of the metal plate 50.

As in the second embodiment, the multilayer circuit board 51 has a two-layer structure including first and second insulating layers, each of which is made of a mixture of an inorganic filler and a resin composition. Lower-level conductive lines are provided between the first and second insulating layers and upper-level conductive lines are provided on the second insulating layer. The upper- and lower-level conductive lines are electrically connected together by way of via metals that are provided through the second insulating layer.

If the holes of the optical reflector 52 are filled with an LED encapsulating resin, then concave or convex lenses may be made of the resin. Alternatively, the holes may be filled with the resin to planarize the surface of the optical reflector 52. However, since the area of the optical reflector 52 is smaller than that of the multilayer circuit board 51, the optical reflector 52 may be molded with a resin in its entirety. If the optical reflector 50 is completely covered with the resin, then the LED bare chips can be encapsulated more tightly.

Figure 13:
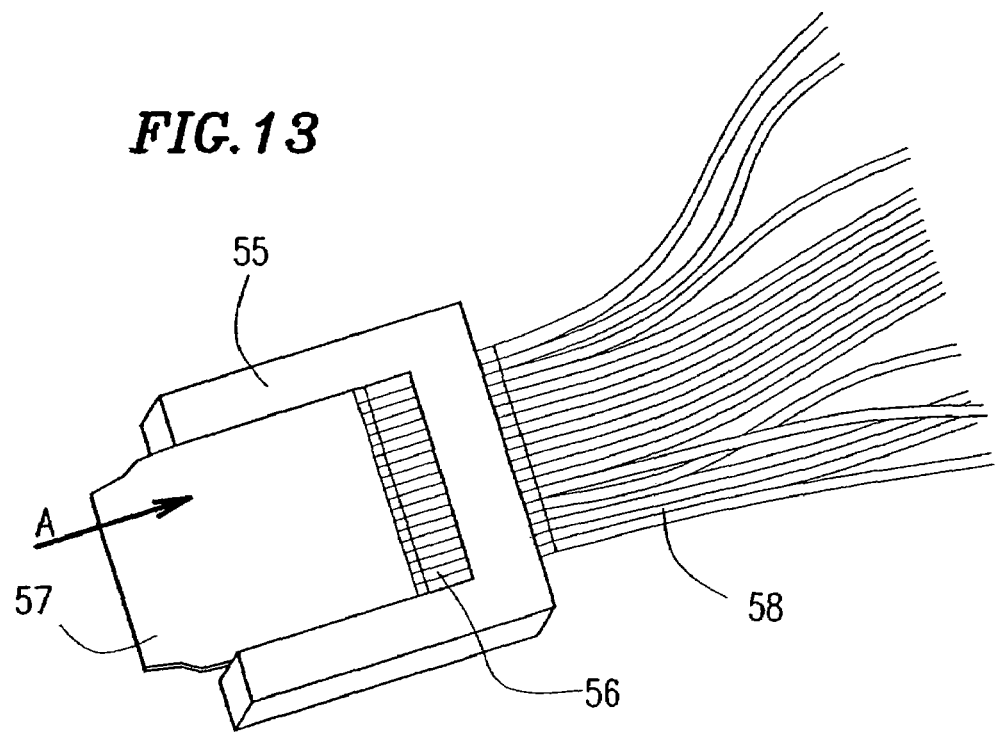
FIG. 13 illustrates a connector that may be used for the LED illumination source of the present invention.

As shown in FIG. 13, the connector to be provided on the illumination apparatus may include: a body 55 with a guide portion for sliding and guiding the card-type LED illumination source thereon; multiple connector electrodes 56 to be electrically connected to the card-type LED illumination source; a metal plate (or bottom plate) 57 with a good thermal conductivity; and interconnecting cords 58 for connecting the connector electrodes to a circuit such as a lighting drive circuit.

When inserted into this connector, the card-type LED illumination source has its feeder terminals 54 contacted with, and connected to, their associated connector electrodes 56. To improve the heat dissipation performance, when the card-type LED illumination source is inserted into this connector, all or part of the back surface of the metal plate 50 preferably contacts thermally with the metal plate 57 of the connector.

In this embodiment, the feeder terminals 54 are arranged and collected along just one of the four sides of the upper surface of the multilayer circuit board 51 as shown in FIG. 12. Accordingly, the card-type LED illumination source is inserted into the connector by being pushed in the direction indicated by the arrow A in FIG. 12.

As can be seen from FIG. 12, the size of the multilayer circuit board 51 is greater than that of the optical reflector 52 by the area of the region in which the feeder terminals 54 are provided. Accordingly, in this embodiment, the (optical) center of the region in which the LED bare chips 53 are arranged in matrix (i.e., light outgoing region or LED cluster region) does not correspond with the center of the substrate. Therefore, the center of the bending stress on the card-type LED illumination source does not correspond with the center of the brittle optical system, thus increasing the mechanical strength. Also, since the feeder terminals 54 are collected along one end of the substrate, the other ends of the upper surface of the multilayer circuit board 51, corresponding to the three other sides, do not have to be completely fitted with the inside surfaces of the connector. As a result, the card-type LED illumination source may be designed more freely in respect of the shape, for example.

By appropriately setting the size of the multilayer circuit board 51 (and the metal plate 50) in the length direction (i.e., the size of its two sides that are parallel to the arrowed direction A), the optical center may be shifted to any location arbitrarily.

The optical reflector 52 basically has the same structure as the optical reflector 3 shown in FIG. 4(*a*), and has the same number of openings as that of the LED bare chips 53 to be arranged. The openings of the optical reflector 52 are preferably filled with resin lenses, with which the LED bare chips 53 are encapsulated. Thus, the LED bare chips 53 can be connected to the multilayer circuit board 51 more tightly. If the connection between the LED bare chips 53 and the multilayer circuit board 51 is consolidated in this manner, then screw holes may be provided through the card body of the card-type LED illumination source or portions of the edges of the card-type substrate may have screwing recesses to screw the card-type LED illumination source onto a heat-dissipating member.

Figure 14A:
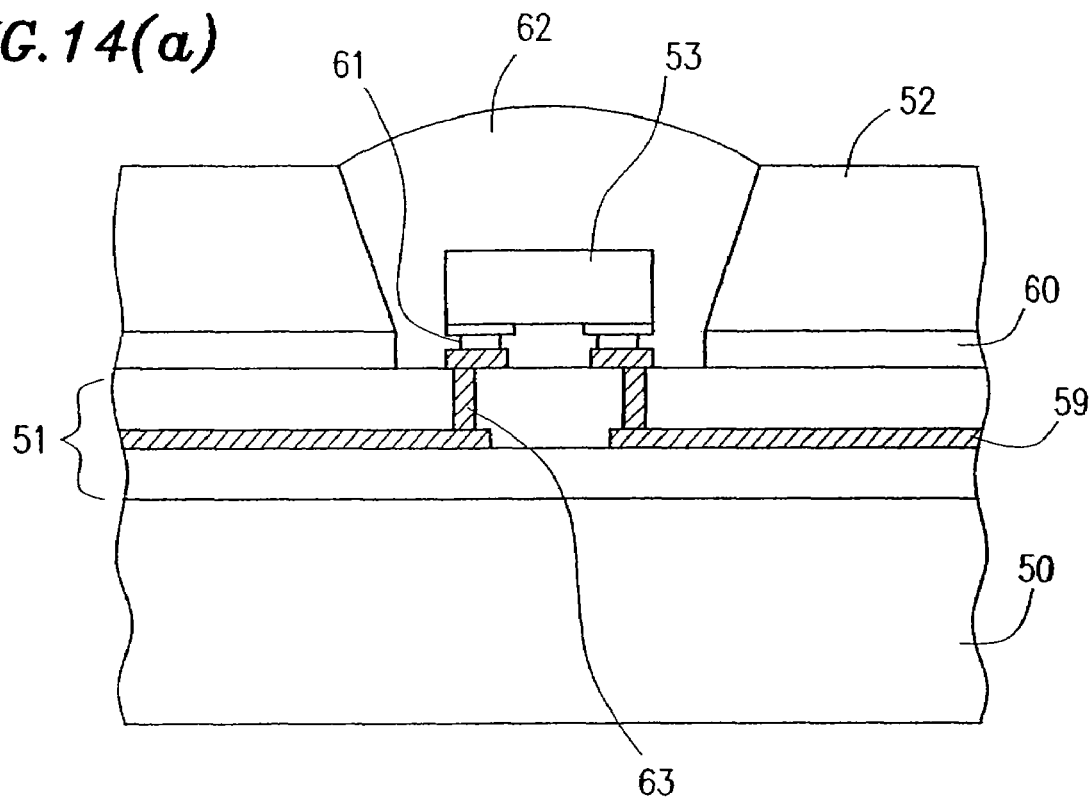
FIG. 14(a) is a cross-sectional view illustrating a portion of the card-type LED illumination source shown in FIG. 12 in which an LED is provided.

The configuration of the card-type LED illumination source of this embodiment will be described in further detail with reference to FIGS. 14(*a*) and 14(*b*). FIG. 14(*a*) shows an LED bare chip 53 that has been flip-chip bonded with its active layer turned facedown. In this embodiment, one of multiple different bonding methods is adopted according to the type of each LED bare chip 53 as will be described later.

The LED bare chip 53 has been mounted so as to be connected to the conductive line patterns 59 of the multilayer circuit board 51 and fixed on the multilayer circuit board 51. After the LED bare chips 53 have been mounted on the multilayer circuit board 51, the metallic optical reflector 52 is bonded onto the multilayer circuit board 51.

The multilayer circuit board 51 includes the two-layer conductive line patterns 59. Specifically, the conductive line patterns 59 belonging to two different layers are interconnected together by via metals 63. The conductive line pattern 59 on the uppermost layer is connected to the electrodes of the LED bare chip 53 by way of Au bumps 61. The conductive line patterns 59 may be made of copper, nickel, aluminum or an alloy mainly composed of these metals.

As described above, such a multilayer circuit board 51 includes insulating layers, each of which is made of a mixture of a resin composition and an inorganic filler with electrical insulating property. This mixture preferably includes a thermosetting resin. By appropriately selecting the types and quantities of the resin composition and inorganic filler that make up the insulating layer, the thermal conductivity, linear expansivity and dielectric constant of the insulating layer are adjustable. The insulating layer preferably has a thermal conductivity of 1 W/m·K to 10 W/m·K and is preferably white. If such a white insulating layer is adopted, then visible radiation is reflected by exposed portions of the insulating layer at a higher reflectivity and the optical efficiency is further improved.

As the inorganic filler, at least one filler is preferably selected from the group consisting of $Al_2O_3$, MgO, BN, $SiO_2$, SiC, $Si_3N_4$ and AlN with excellent thermal conductivities. The mean particle size of the inorganic filler is preferably within the range of 0.1 μm to 100 μm. This is because if the mean particle size is out of this range, the fill density of the filler or the heat dissipation performance of the substrate will decrease.

As the thermosetting resin, at least one resin is preferably selected from the group consisting of epoxy resin, phenol resin and cyanate resin. This is because the electrical insulating property, mechanical strength and heat resistance of each of these resins cured are superior to those of any other cured resin. If necessary, the resin composition may further include an additive such as coupling agent, dispersing agent, coloring agent or release agent.

A sample card-type LED illumination source was modeled by a method in which two sheets, each having a thickness of 160 μm and made of a composite material of an alumina filler, were used and in which a multilayer circuit board, including two insulating layers with a total thickness of 320 μm, was prepared and bonded onto a metal base of aluminum. When LED bare chips were directly mounted on the two-layered alumina composite substrate on the metal base of aluminum, the thermal resistance between the LED bare chips and the base metal measured about 1° C./W.

Suppose the heat should be dissipated naturally from this sample by a heat sink in no wind condition and 64 LED bare chips with sizes of about 0.3 mm square should be driven at 40 mA, which is a current twice as much as a rated current and which has a current density of about 444 $mA/mm^2$. In that case, to maintain the temperature of the LED bare chips at about 80° C., the heat sink needs to have a surface area of about 300 $cm^2$. Also, if the LED bare chips are operated with such a large current in a natural air cooling condition, then the thermal resistance between the LED bare chips and the base metal needs to be about 10° C./W or less.

In natural air cooling, the temperature of the LED bare chips should not exceed the range of 80° C. to 120° C. This is because the resin encapsulant (i.e., epoxy or silicone resin) of the LED bare chips would significantly deteriorate thermally and optically at a temperature exceeding that range.

If the thermal resistance is about 5° C./W or less, even a heat sink with a normal finite area, not the heat sink with an ideal big area, should realize sufficient heat dissipation in the natural air cooling condition. Furthermore, if the thermal resistance is about 2° C./W to about 1° C./W or less, even a small-sized heat sink should realize sufficient heat dissipation.

A system with a thermal resistance of 1° C./W or less is also realizable either by reducing the thickness of the insulating layers or by using insulating layers of a boron-based composite material with a thermal conductivity of about 3 W/mK to about 5 W/mk instead of the alumina composite insulating layers with a thermal conductivity of about 2 W/mK to about 4 W/mK. In that case, similar effects are also achievable even if the area of the heat sink is further reduced.

Furthermore, even when silica composite insulating layers with a thermal conductivity of 1 W·mK to 2.5 W·mK are used, a thermal resistance falling within the above-specified range is also realizable by making the insulating layers thinner than insulating layers with a higher thermal conductivity.

Each of the conductive line patterns 59 of the multilayer circuit board 51 may be defined by forming a conductive line pattern on a release carrier such as an organic film and then transferring the conductive line pattern from the release carrier onto the insulating layer. The conductive line pattern may be formed on the release carrier by bonding a metal foil (e.g., copper foil) onto the release carrier with an adhesive, for example, depositing a metal film on the metal foil by an electrolytic or electroless plating technique, and then patterning the metal film by a chemical etching process. However, if the conductive line pattern is made of the metal foil, the surface of the insulating layer is preferably roughened to increase the adhesive strength of the metal foil.

The conductive line pattern 59 may be formed by any other method. Also, the conductive line pattern 59 may be either inlaid in the insulating layer or adhered to the flat surface of the insulating layer. The via metals 63 to conductive line together the conductive line patterns 59 belonging to mutually different layers may be formed by plating the inner surface of holes (i.e., via holes or through holes) that have been provided through the insulating layer or by filling the holes with a conductive resin composition.

The upper surface of the multilayer circuit board 51 with such a structure is mostly covered with the optical reflector 52 but is also partially exposed. The feeder terminals 54 are provided on the exposed region on the multilayer circuit board 51. These feeder terminals 54 are electrically connected to the lighting drive circuit of the illumination apparatus by way of the connector, into which the card-type LED illumination source is inserted.

An underfill (or stress relaxing layer) 60 is provided between the optical reflector 52 and the multilayer circuit board 51. The underfill 60 not only relaxes the stress to be caused by the difference in thermal expansion coefficient between the metallic optical reflector 52 and the multilayer circuit board 51 but also ensures electrical insulation between the optical reflector 52 and the upper-level conductive lines on the multilayer circuit board 51.

All of the optical reflector 3 is preferably made of a metal. By sandwiching the insulating layers as the substrate (which will be herein referred to as a "substrate insulating layers") between the substrate base metal and the metallic reflector, heat can be dissipated from both sides of the substrate. In addition, the heat at the mounting side of the LEDs, heat-generating bodies, can be uniformly distributed from the center portion toward the peripheral portions. Secondary effects of minimizing the warpage of the two metal plates from both sides of the substrate insulating layer are also expected as well.

Furthermore, if the substrate insulating layers are made of a composite material including a resin composition and an inorganic filler, then the elasticity of such a composite material can relax the stress to be placed on the two metal plates. As a result, the illumination apparatus to be kept ON at an elevated temperature to supply high power can have its reliability increased.

Also, to further relax the stress and further increase the reliability, the stress relaxing layer to be provided between the optical reflector and the substrate insulating layers needs to be made of a material that is different from those of the optical reflector and insulating layers. A gap may be created between the insulating layer and the optical reflector by providing either bumps on the conductive lines on the insulating layer or lands for bumps in addition to the conductive lines. The gap may be filled with either the underfill or the resin (i.e., epoxy or silicone resin) to mold the LEDs. Even so, the stress may also be relaxed. If such stress relaxing means is provided, unintentional turn OFF or decrease in reliability is avoidable even under a strict condition that stress is applied due to the thermal shock of a flashing test.

The openings of the optical reflector 52 are closed with lenses that have been made of a molded resin 62. To improve the heat dissipation performance, the optical reflector 52 is preferably a metal plate of aluminum, for example. However, a plate made of any other insulating material may also be used. In that case, at least portion (preferably all) of the inner sidewall of the openings is preferably coated with a reflective film that is made of a material having a higher reflectivity than that of the insulating plate, e.g., a metal such as Ni, Al, Pt, Ag or Al or an alloy mainly composed of these metals. Then, the light that has been emitted sideward from the LEDs is appropriately reflected by the reflective film. As a result, the optical efficiency can be increased.

The backing metal plate 50 does not have to be made of aluminum but may also be made of copper. The back surface of the metal plate 50 is preferably flat so as to contact with a good thermal conductor provided for the connector, for example, and thereby improve the heat dissipation performance. However, fins or linearly embossed portions may be provided on portions of the back surface for heat dissipation purposes. In that case, embossed portions to engage with the fins or linearly embossed portions are preferably provided on the surface of the member that will contact with the back surface of the metal plate 50. In the configuration in which the card-type LED illumination source is slid and connected to the connector, those fins or linearly embossed portions to be provided on the back surface of the metal plate preferably extend in the sliding direction so as not to interfere with the sliding movement. Then, the fins or linearly embossed portions themselves function as guides and the area of contact can be increased advantageously.

To increase the thermal contact between the thermal conductor member and the card-type LED illumination source, a mechanism for pressing the thermal conductor member onto the card-type LED illumination source is preferably adopted. Such pressure may be applied by feeder terminals with some elasticity. However, to obtain a sufficient pressure from such feeder terminals alone, the feeder terminals need to have rather strong elasticity. If a mechanical pressure to be applied to achieve electrical contact with the feeder terminals is about 50 g to about 100 g per terminal, then pressing means for applying a stronger pressure is preferably provided additionally. As such pressing means, an elastic member for applying a pressure of 200 g or more to portions of the card-type LED illumination source other than the feeder terminals thereof may be provided. A number of such pressing means may be provided as well.

If such pressing means is provided, then the mechanical pressure to be applied to the feeder terminals does not have to be so high. Thus, the card-type LED illumination source can be easily inserted or removed manually with human fingers. That is to say, after having fitted the card-type LED illumination source into the connector of the LED illumination apparatus, the user can press the back surface of the substrate of the card-type LED illumination source onto the thermal conductor member strongly with the pressing means. As a result of such high pressure, the card-type LED illumination source is locked onto the LED illumination apparatus so to speak, and will not drop down from the apparatus accidentally.

Figure 14B:
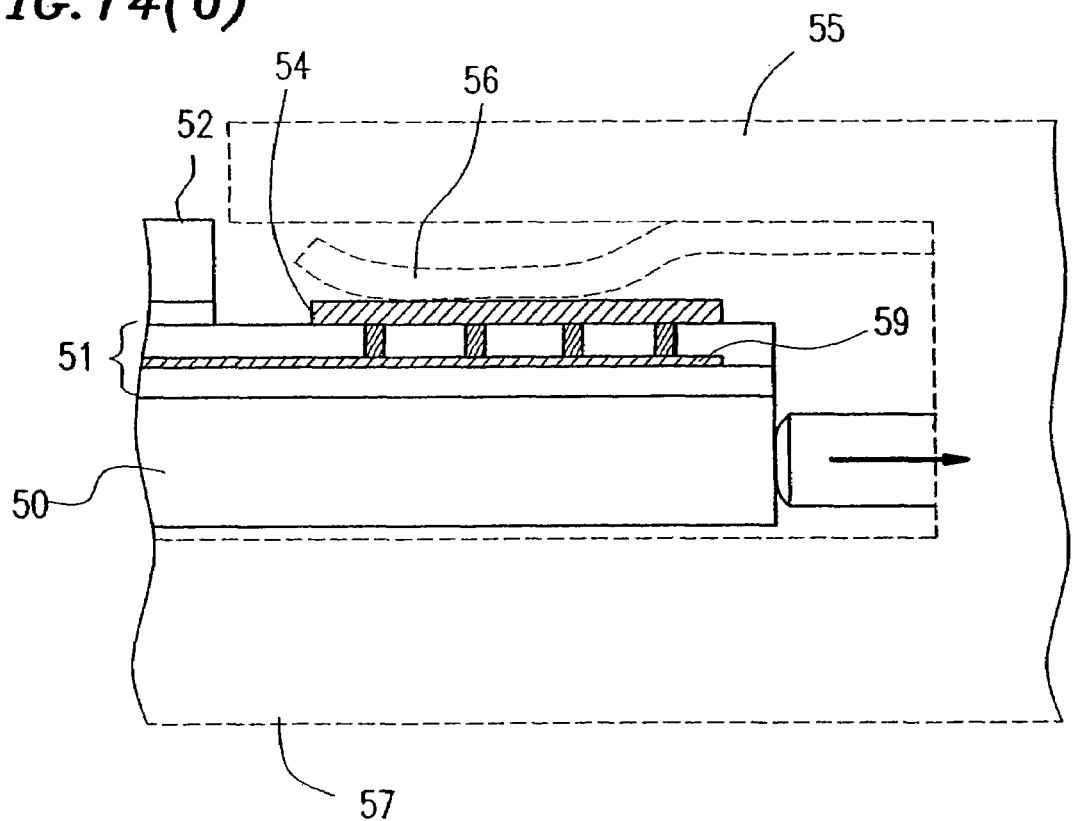
FIG. 14(b) is a cross-sectional view illustrating another portion thereof in which feeder terminals are provided.

FIG. 14(b) illustrates a cross section of one end of the card-type LED illumination source that is connected to the connector. In FIG. 14(b), the connector is indicated by the dashed lines. It should be noted that the card-type LED illumination source shown in FIG. 14(b) is illustrated as being thinner than the counterpart shown in FIG. 14(a) for convenience sake.

As can be seen from FIG. 14(b), the feeder terminal 54 is provided on the end of the multilayer circuit board 51 so as to be located near the connector, and is electrically connected to the conductive line pattern 59 either directly or through the via metals. The region of the multilayer circuit board 51, on which the feeder terminal 54 is located, is not covered with the optical reflector 52. Thus, the connector electrode 56 can easily contact with the feeder terminal 54.

The connector electrode 56 and feeder terminal 54 can be easily connected or disconnected electrically by inserting or removing the card-type LED illumination source into/from the connector. If a switch that senses the insertion or removal of the card-type LED illumination source is provided near the end of the connector, at which the card-type LED illumination source arrives when inserted, such that current is blocked while no card-type LED illumination source is inserted, then safety increases. In that case, such a switch may be provided under, beside or over the card.

In FIG. 13, the connector electrodes 56 are illustrated as being visible externally. However, actual connector electrodes 56 are preferably designed such that the user cannot lay his or her fingers on the electrodes 56 as shown in FIG. 14(b).

In this embodiment, four types of LED bare chips, each consisting of 16 LED bare chips that emit red (R), green (G), blue (B) or yellow (Y) light ray, are arranged on the same substrate. The dimensions of the substrate include a longer-side length of 28.5 mm, a shorter-side length of 23.5 mm and a thickness of 1.3 mm. The rectangular region on which the 64 LED bare chips are arranged has dimensions of 20 mm by 20 mm by 1 mm (thickness). In this example, the region on which the LEDs are arranged (i.e., the region where the reflector is present) is about 2 cm square. This area of the light emitting portion is approximately equalized with the bulb sizes of normal low-watt small-sized light bulbs (e.g., small spherical light bulbs or mini krypton lamps) such that the LED illumination source can replace any of these existent low-watt light bulbs. A small spherical light bulb can obtain a total luminous flux of about 20 lm to about 50 lm at a power of about 5 W to about 10 W. On the other hand, a mini krypton lamp can obtain a total luminous flux of about 250 lm to about 500 lm at a power of about 22 W to about 38 W.

According to the results of experiments the present inventors carried out, in an embodiment in which white-light-emitting LEDs were operated at room temperature (25° C.) in natural air cooling condition, a luminous flux of about 100 lm to about 300 lm was obtained and approximately the same quantity of light was obtained from a light emitting portion having sizes substantially equal to those of a small-sized light bulb. Also, if the card-type LED illumination source is packaged in a casing having sizes corresponding to those of a beam light bulb so as to have a diameter not exceeding that of a beam type dichroic halogen lamp and if the center of the light outgoing region with the reflector (i.e., the light emitting region) is aligned with the center of the optical axis of the light bulb, then the distance from the center of the light emitting portion to the end of the longer side of the substantially square card (i.e., the side on which the feeder terminals are provided) is:

about 13 mm when the diameter is 35 mm;
about 15 mm when the diameter is 40 mm; or
about 23 mm when the diameter is 50 mm.

The periphery of the substrate preferably has flat portions that can contact with the guide portions. Also, to mold the entire reflector with a resin, the periphery of the substrate preferably has regions on which no LEDs are provided. Such regions are provided on both sides of the light outgoing region having sizes of about 2 cm square. Each of those regions preferably has a width of 1 mm to 3 mm. To increase the size of these regions (or margins), the distance from the center of the light emitting portion to the end facet needs to be decreased.

If the card-type LED illumination source is used either by inserting it or by placing and then pressing it and if the card-type LED illumination source is used both as a luminaire and as a lamp, then the feeder terminals are preferably provided on just one surface of the card-type LED illumination source to make the illumination source compatible with any of various insertion/removal methods. More preferably, the card-type LED illumination source is disposed such that the center of the mirror reflector (or the light outgoing region) is shifted from the geometric center of the substrate.

To get the heat dissipated effectively from the back surface of the substrate of the card-type LED illumination source, the feeder terminals are preferably collected together on the light outgoing side of the substrate. Furthermore, to ensure thermal contact between the back surface of the substrate and the thermal conductor member (i.e., the heat-dissipating means) in a broad area, the card-type LED illumination source is preferably pressed not only by the feeder terminals but also by other pressing means. To get the illumination source pressed by such means, margins are preferably provided on the principal surface of the substrate for that purpose.

The distance from the center of the light emitting portion to the end facet of the substrate with no feeder terminals may be shorter than the distance from the center of the light emitting portion to the end facet with the feeder terminals. The former distance may be equalized with the width of the margins to be provided on both sides of the light outgoing region. In that case, if four card-type LED illumination sources are densely arranged such that the two sides of each of the illumination sources are in contact with those of two other illumination sources, the gaps between the mirror reflectors (i.e., light outgoing regions) can be equalized with each other and can be as short as possible.

In view of these considerations, the present inventors modeled a sample card-type LED illumination source in which the distance from the center of the light outgoing region (i.e., the center of the light emitting portion) to the end facet of the substrate (i.e., the end facet with the feeder terminals) was about 16.5 mm and in which the distance from the center of the light emitting portion to the opposite end facet of the substrate (opposite to the feeder terminal side) was about 12 mm. By providing a sufficiently wide space on the side opposite to the feeder terminals, via connection with the lower-level conductive line pattern layer is realized outside of the reflector (or the light outgoing region), i.e., on the margin of the substrate. If that portion has a single-layer structure locally, then electrical connection is also realized without using via metals, e.g., by wiring the upper and lower layers together. Conversely, the other side with the feeder terminals may also have such a single-layer structure locally. Also, the number of layers provided may be further increased on just portions of the substrate to design conductive line jumpers more freely. In that case, the margins described above become effective spaces.

In this embodiment, the feeder terminals are designed so as to have a substantially rectangular shape and have a width of 0.8 mm, a length of 2.5 mm and a pitch of 1.25 mm (i.e., distance between the centers of two adjacent feeder terminals) in view of mechanical errors to be caused when the feeder terminals are contacted with the connector electrodes or the manufacturing errors of the via metals. To maximize the number of independent circuits to be provided on the substrate of the card-type LED illumination source, the number of feeder terminals is preferably as large as possible. In the exemplary configuration of this embodiment, 16 feeder terminals may be provided.

Where the number of anode electrodes to be provided is equalized with that of cathode electrodes to be provided to drive the LEDs with a constant current supplied, the feeder terminals may be allocated to the LEDs that emit blue, green (or cyan), yellow (or orange), red and white rays and six supplementary terminals (for three paths) may be provided.

In this embodiment, to ensure a minimum insulation distance between the feeder terminals and the metal base substrate, the distance from the edge of the feeder terminals to the end facet of the substrate is defined to be at least 2 mm. To further increase this electrical insulation, the gap between the feeder terminals may have a three-dimensional shape, not a planar shape. That is to say, a rib may be formed by the insulating layer.

FIG. 15 illustrates an equivalent circuit showing how 64 LED bare chips, provided for a single card-type LED illumination source, may be interconnected together. In FIG. 15, R (+) denotes the anode side of red-ray-emitting LED bare chips while R (−) denotes the cathode side of the red-ray-emitting LED bare chips. The same statement is applicable to the other colors (Y, G and B).

Figure 16:
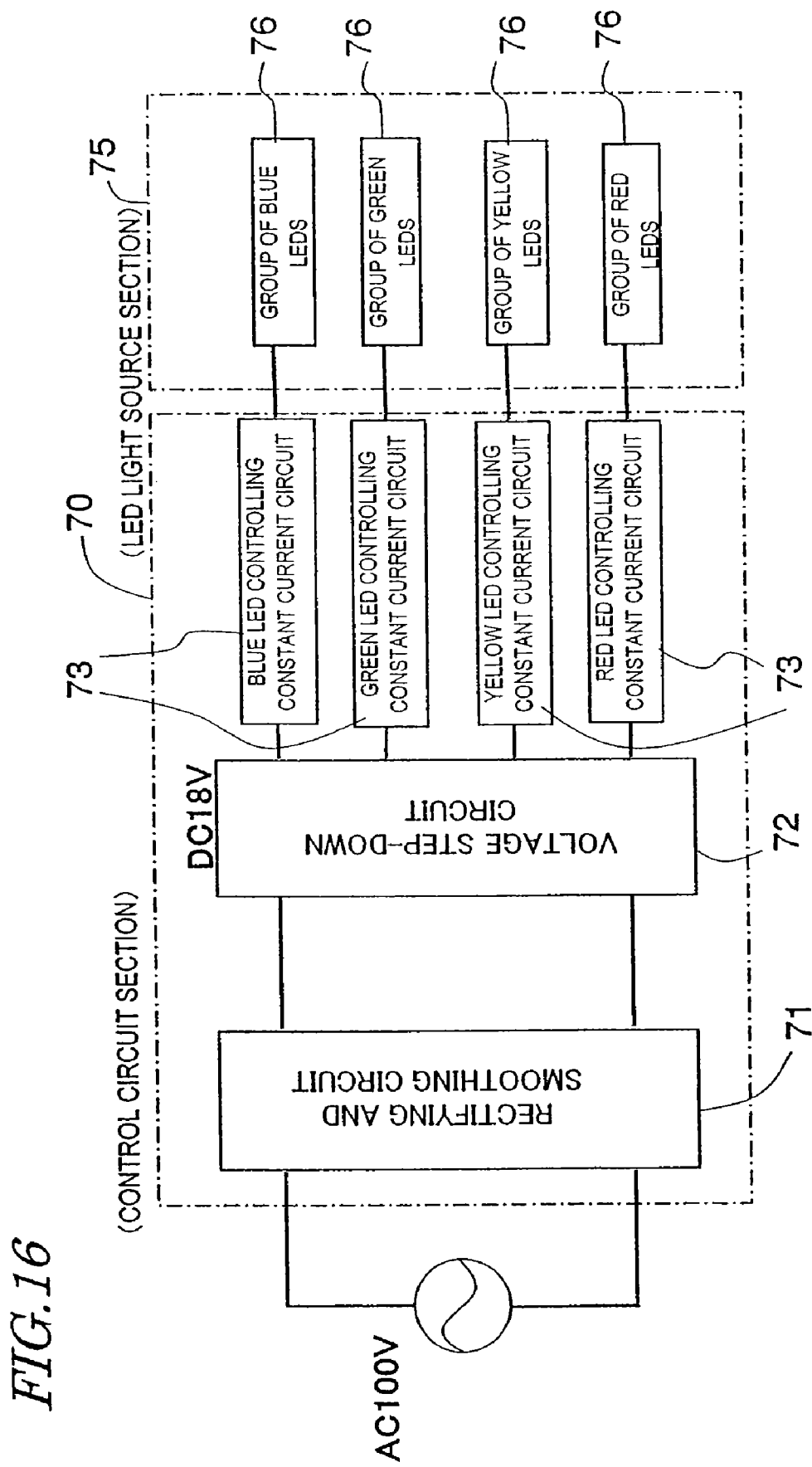
FIG. 16 is a block diagram showing a configuration for the lighting drive circuit of an LED illumination apparatus to which the card-type LED illumination source shown in FIG. 12 is inserted.

FIG. 16 is a block diagram showing an exemplary configuration for an LED lighting drive circuit. In the exemplary configuration shown in FIG. 16, the lighting drive circuit 70 of a card-type LED illumination source includes a rectifying and smoothing circuit 71, a voltage step-down circuit 72 and constant current circuits 73. The rectifying and smoothing circuit 71 is a known circuit, which is connected to an AC power supply of 100 V and which converts an alternating current into a direct current. It should be noted that the power supply does not have to be AC 100 V but may be a DC power supply. When a DC power supply is adopted, the rectifying and smoothing circuit 71, which is a combination of a smoothing circuit and voltage step-down circuit, may be replaced with a voltage transformer (i.e., voltage step-down and step-up transformer).

The voltage step-down circuit 72 decreases the DC voltage to an appropriate voltage to make the LEDs emit light (e.g., 18 V). The constant current circuits 73 include blue, green, yellow and red LED controlling constant current circuits. Each of these LED controlling constant current circuits adjusts the current to be supplied to a group of LEDs 76 in its associated color in the card-type LED illumination source 75 to a constant value. The constant current circuits 73 may be electrically connected to the groups of LEDs 76 by fitting the card-type LED illumination source 75 in the connector of the illumination apparatus. More specifically, the electrical continuity is realized by bringing the feeder terminals, provided on the substrate of the card-type LED illumination source 75, into contact with their associated feeder terminals inside the connector.

Such a lighting drive circuit 70 includes an electrolytic capacitor as a circuit component thereof. If the temperature of the electrolytic capacitor reaches about 100° C., its life shortens significantly. For that reason, the temperature near the electrolytic capacitor should be sufficiently lower than 100° C. In this embodiment, the heat generated in the card-type LED illumination source 75 is dissipated by the heat-dissipating means by way of the metal plate of the card-type LED illumination source 75 and then the heat-dissipating member of the illumination apparatus. Accordingly, the temperature near the electrolytic capacitor of the lighting drive circuit is maintained at about 80° C. or less. As a result, the life of the lighting drive circuit can also be extended.

In this embodiment, the groups of LEDs 76 for the colors blue, green (or cyan), yellow (or orange) and red are driven with a constant current supplied thereto, and therefore, applied with a ground potential separately. Accordingly, the number of feeder terminals to be provided for the card-type LED illumination source 75 of this embodiment is eight. Half of the eight feeder terminals function as anode electrodes while the other half functions as cathode electrodes.

Hereinafter, multilevel conductive line patterns for the card-type LED illumination source of this embodiment will be described with reference to FIGS. 17 and 18. Specifically, FIG. 17 illustrates a layout for the upper-level conductive line pattern of the multilayer circuit board, while FIG. 18 illustrates a layout for the lower-level conductive line pattern thereof.

Figure 17:
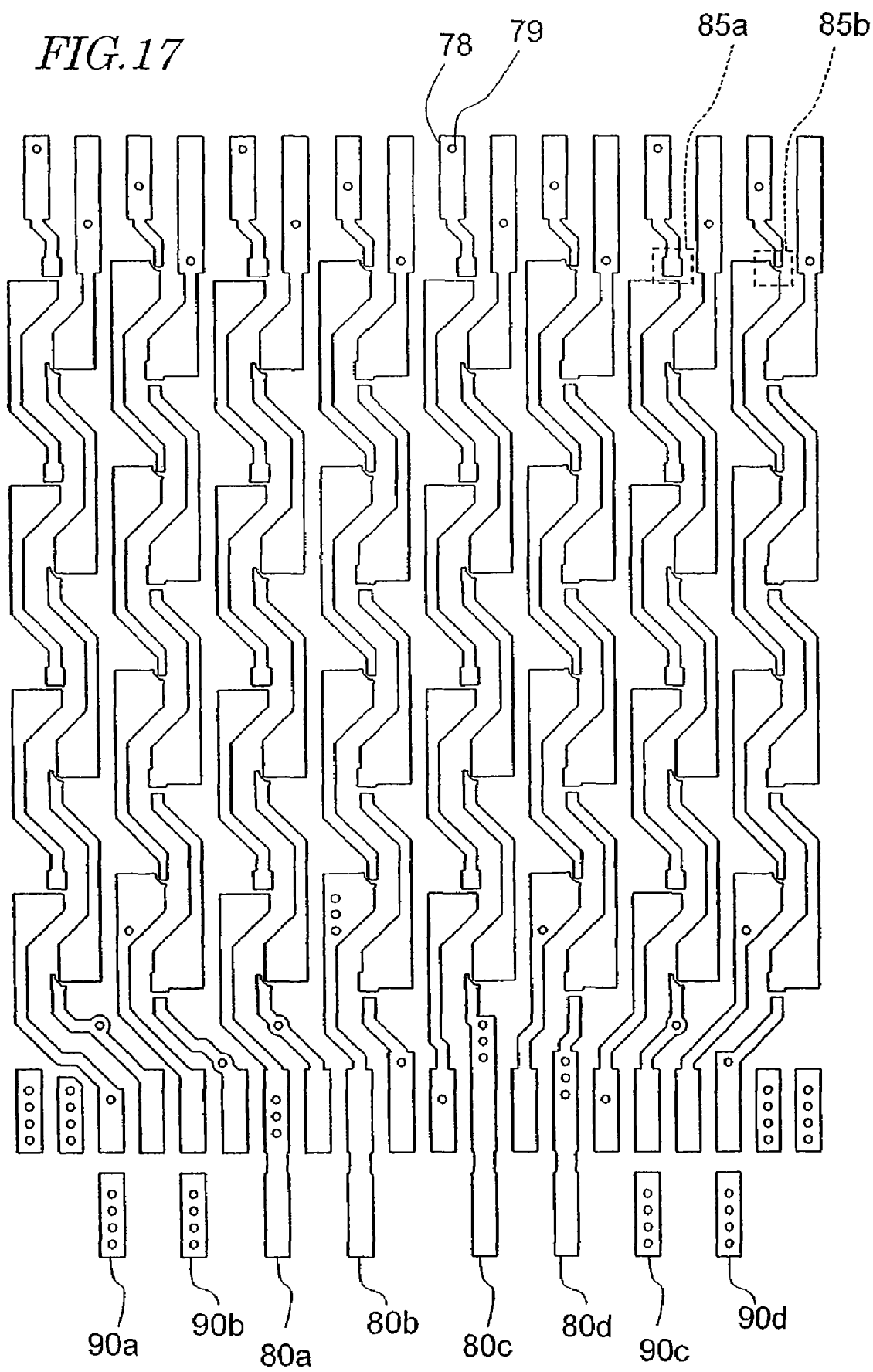
FIG. 17 is a planar layout illustrating an upper-level conductive line pattern of the card-type LED illumination source shown in FIG. 12.
Figure 18:
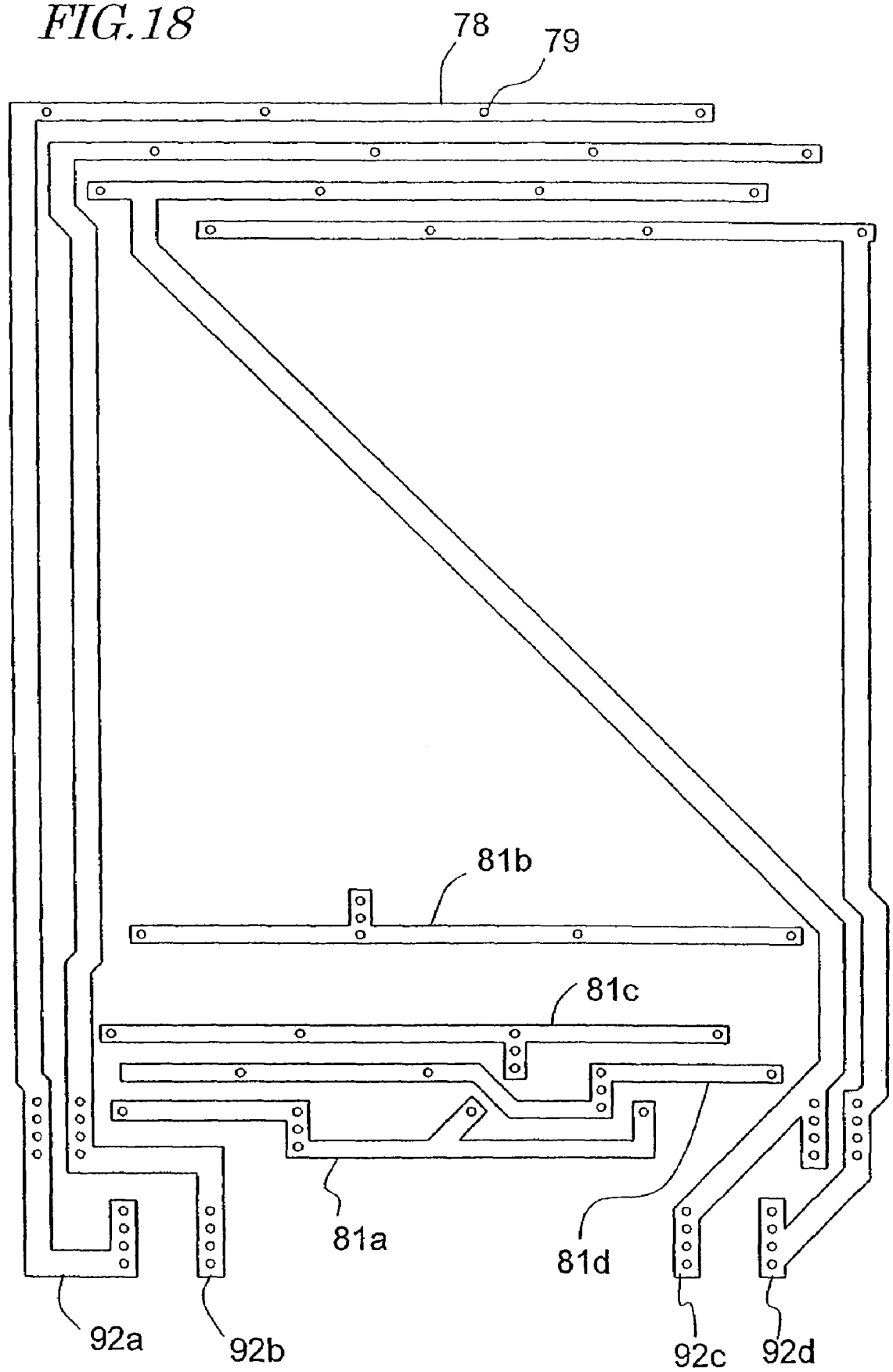
FIG. 18 is a planar layout illustrating a lower-level conductive line pattern of the card-type LED illumination source shown in FIG. 12.

In FIGS. 17 and 18, small circular regions 79 shown on the conductive lines 78 indicate the locations of the via metals to interconnect the upper- and lower-level conductive line patterns together. In FIGS. 17 and 18, the reference numerals 78 and 79 each identify just one member for the sake of simplicity. However, it should be naturally understood that a large number of conductive lines and a large number of via metals are actually provided.

The LED bare chips are mounted on regions 85a and 85b, for example, which are indicated as representative ones by the dashed lines in FIG. 17. FIGS. 19(a) and 19(b) respectively show the regions 85a and 85b on a larger scale. On the portion shown in FIG. 19(a), the LED bare chip is flip-chip (FC) bonded. On the portion shown in FIG. 19(b) on the other hand, the LED bare chip is wire-bonded (WB bonded). FIG. 19(c) shows a cross section of the FC-bonded LED bare chip, while FIG. 19(d) shows a cross section of the WB-bonded LED bare chip.

In this embodiment, the LED bare chips to emit blue or green (or cyan) light are FC bonded and the LED bare chips to emit yellow (or orange) or red light are WB bonded.

In an LED bare chip (or element) to emit the red or yellow (or orange) light (i.e., light with a relatively long wavelength), its multilayer structure, including a light-emitting layer, is normally formed on a GaAs substrate. The GaAs substrate cannot transmit the red or yellow light easily, and therefore, is disposed under the light-emitting layer. Accordingly, such an LED bare chip cannot be bonded facedown.

In the FC bonded structure shown in FIG. 19(c) on the other hand, n and p electrodes are disposed so as to face the light-emitting layer of the LED bare chip, and are connected to the conductive lines (i.e., the upper-level conductive lines) on the multilayer circuit board by way of Au bumps.

In this embodiment, the conductive line pattern on the substrate is formed by plating a copper foil with nickel and then further plating the nickel with gold. By setting the thickness of the copper foil to 35 µm or less, a partially fine pattern with a lateral size of 50 µm or less, which is required in a flip-chip bonding process, is obtained. If such a partially fine pattern is formed, the gap between the electrodes can be shortened locally in portions to be flip-chip bonded with a large line-and-space value maintained over the entire substrate as defined by the pattern design rule. As a result, the conductive line pattern can be defined efficiently and the production yield of the substrates increases.

Also, since the conductive line pattern should be provided discretely on the substrate, the conductive line pattern was formed by an electroless plating technique under some conditions. In a sample, nickel was plated to a thickness of about 6 µm and gold to be plated thereon was deposited to a thickness of 0.6 µm. By plating gold to a sufficient thickness in this manner, decrease in bond strength, which might be caused due to the fusion of gold while the LED bare chip is metal-bonded to the conductive line pattern, can be compensated for.

Optionally, to increase the reflectivity in regions on which no LED bare chips are mounted, a layer or a member, made of a material with a high reflectivity, may be provided on the conductive line pattern or on the surface of the substrate.

On the other hand, in an LED bare chip (or element) to emit blue or green (or cyan) light (i.e., light with a relatively short wavelength), its multilayer structure, including the light emitting layer, is normally provided on a sapphire substrate. The sapphire substrate transmits the blue or green light, and can be disposed at an arbitrary location, i.e., may be located either under or over the light-emitting layer. Since the FC bonded structure contributes more effectively to increasing the density, the blue-ray-emitting LED bare chips and green-ray-emitting LED bare chips are FC bonded on the substrate in this embodiment. In the WB-bonded structure shown in FIG. 19(d), the n and p electrodes are provided on the back surface of the substrate and closer to the light-emitting layer of the LED bare chip, respectively. The p electrode is connected to the conductive line (i.e., the upper-level conductive line) on the multilayer circuit board with a bonding wire. The n electrode is connected to the conductive line (i.e., upper-level conductive line) on the multilayer circuit board with a conductive paste, solder, a metal bond, or an anisotropic conductive adhesive, for example. Optionally, an underfill material may also be used as well to consolidate these bonds.

It should be noted that the structures and bonding methods of the LEDs to emit light rays in those colors are not limited to those exemplified for the foregoing embodiment. Optionally, the LEDs on the same substrate may be all bonded by a single bonding method or by three or more bonding methods. In any case, each of those LEDs is preferably mounted by the best bonding technique to be selected on the specific structure of the LED. Also, to increase the reliability of bonding with the element, at least the surface of the conductive line pattern on the substrate is preferably a gold layer. To get the element metal-bonded with the gold layer just as intended, the gold layer preferably has a thickness of at least 0.5 µm, more preferably 1 µm or more.

If multiple types of LEDs are arranged on the same substrate or if the LEDs are arranged on the same substrate by multiple bonding methods, the location of the light-emitting layer of one LED may be different from that of the light-emitting layer of another LED. Accordingly, the geometric shape (e.g., focal point or aperture ratio) of a lens to be provided for each of those LEDs is preferably optimized according to the location of the light-emitting layer of the LED or the chromatic aberration to be caused depending on the color of the emission.

The layouts of the conductive lines will be described with reference to FIGS. 17 and 18.

The electrodes 80*a*, 80*b*, 80*c* and 80*d* shown in FIG. 17 are feeder terminals to supply an anode potential to the four groups of LEDs to emit red, blue, green and yellow light rays, respectively. On the other hand, the electrodes 90*a*, 90*b*, 90*c* and 90*d* are feeder terminals to supply a cathode potential (i.e., ground potential) to the four groups of LEDs to emit the red, blue, green and yellow light rays, respectively.

The electrodes 80*a*, 80*b*, 80*c* and 80*d* are respectively connected to the conductive lines 81*a*, 81*b*, 81*c* and 81*d* shown in FIG. 18 by way of via metals. On the other hand, the electrodes 90*a*, 90*b*, 90*c* and 90*d* shown in FIG. 17 are respectively connected to the conductive lines 92*a*, 92*b*, 92*c* and 92*d* shown in FIG. 18 by way of via metals.

A circuit that is substantially equivalent to the circuit shown in FIG. 15 is realized by the multilayer structure shown in FIGS. 17 and 18. However, each of the conductive line patterns may naturally have any other layout and is not limited to the layout shown in FIG. 17 or 18.

In this embodiment, the feeder terminals (consisting of the anode and cathode electrodes) 80*a* through 80*d* and 90*a* through 90*d* are all arranged in line in the region shown at the bottom of FIG. 17. In this manner, the feeder terminals are collected together near one side of the substrate, thus making it easier to connect the card-type LED illumination source to the connector. The ground lines can also be isolated from each other for the respective groups of LEDs to emit light rays in multiple different colors and yet the feeder terminals can be collected together by one side of the substrate. This is because the multilayer structure described above is adopted in this embodiment.

As described above, in this embodiment, no feeder terminals are provided on the back surface of the metal plate of the card-type LED illumination source, and the back surface of the metal plate is flat. Accordingly, a wide area of contact is ensured between this metal plate and a member with a good thermal conductivity (included in the illumination apparatus). Thus, the heat can be dissipated away more efficiently from the card-type LED illumination source. The area of contact is preferably equal to or greater than the area of the region in which the LEDs are arranged (i.e., the light outgoing region or LED cluster region).

In the embodiment described above, four types of LED bare chips to emit light rays with multiple different wavelengths are arranged on the same substrate. However, the present invention is in no way limited to this specific preferred embodiment. Thus, the number of colors of the emissions (or the number of wavelength ranges to which those emissions belong) may be one, two or three or more than four. Alternatively, even an LED bare chip that radiates multiple types of emissions or an LED bare chip to emit white light by adding a phosphor thereto may also be used. It should be noted that unless an LED bare chip to emit white light is used, an LED bare chip normally needs to be coated with a phosphor for the purpose of emitting white light. In that case, if the phosphor is encapsulated in the space that is defined by the substrate and the reflector, the phosphor can be excited by the LED. Alternatively, a sheet on which a phosphor is dispersed may be attached onto the upper surface of the reflector. As another alternative, the phosphor-dispersed sheet itself and the card-type LED light source may be molded together with a transparent resin material.

EMBODIMENT 4

Hereinafter, various specific embodiments of LED illumination apparatuses according to the present invention will be described with reference to FIGS. 20 through 31.

Figure 20:
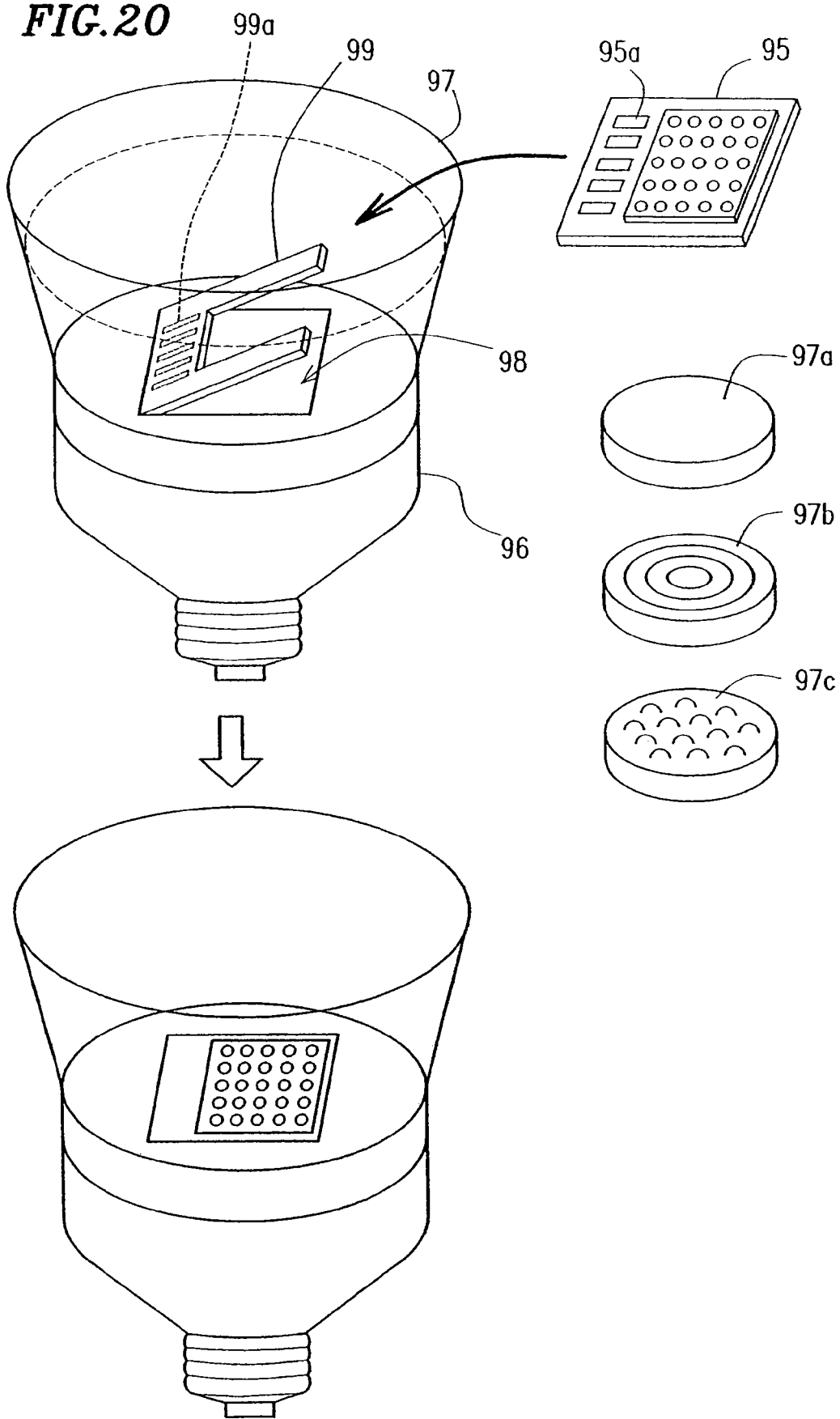
FIG. 20 illustrates a light bulb type LED illumination apparatus as another specific embodiment of an LED illumination apparatus according to the present invention.

First, referring to FIG. 20, illustrated is a light bulb type LED illumination apparatus. This LED illumination apparatus basically has the same configuration as the LED illumination apparatus shown in FIG. 3(*b*), but is different from the counterpart shown in FIG. 3(*b*) in the method of introducing the card-type LED illumination source into the illumination apparatus. Specifically, the LED illumination apparatus shown in FIG. 20 is used as a combination of the body 96 of the illumination apparatus and a transparent housing 97. To remove the card-type LED illumination source 95, the transparent housing 97 should be temporarily taken off the body 96. A receiving portion 98, in which the card-type LED illumination source 96 is fitted, is provided on the upper surface of the body 96. The body 96 further includes a fixing lid 99, which is used to press the upper surface of the card-type LED illumination source 96 that has been fitted in the receiving portion 98 and to fix the illumination source 96 onto the receiving portion 98. The fixing lid 99 is supported so as to rotate (i.e., open and close) around a shaft that is provided near one end thereof, and includes connector electrodes 99*a* to contact with the feeder terminals 95*a* on the card-type LED illumination source 95. These connector electrodes 99*a* are connected to a lighting drive circuit (not shown) that is provided inside the body 96. When combined, the fixing lid 99 and the receiving portion 98 together function as a sort of "connector".

The fixing lid 99 has such a structure as exposing the light outgoing region of the card-type LED illumination source 95 that is stored in the receiving portion 98 while pressing the feeder terminals 95*a* and other portions downward. When the fixing lid 99 is closed, the back surface of the substrate of the card-type LED illumination source 95 thermally contacts with the bottom of the receiving portion 98. The bottom of the receiving portion 98 is preferably made of a material with a good thermal conductivity (e.g., a metal material such as aluminum). Such a good thermal conductor functions as a heat sink, which can dissipate the heat that has been generated in the card-type LED illumination source 95 and can prevent an excessive rise in temperature of the illumination source 95.

In a preferred embodiment, this illumination apparatus is constructed such that the transparent housing 97 can be easily removed, and the fixing lid 99 can be easily opened and closed, with the user's hands or fingers and without using any special tool. Thus, the card-type LED illumination source 95 can be easily replaced (i.e., inserted or removed). The transparent housing 97 may have a light diffusing property. Also, the transparent housing 97 may be replaced with another housing 97*a* that is made of a colorant, a phosphor or a phosphor. Alternatively, a lenticular lens 97*b* or a light diffusing housing 97*c* may also be used. As another alternative, a double lens, a reflector, or a housing having the functions of these optical members in combination may also be used.

Figure 21:
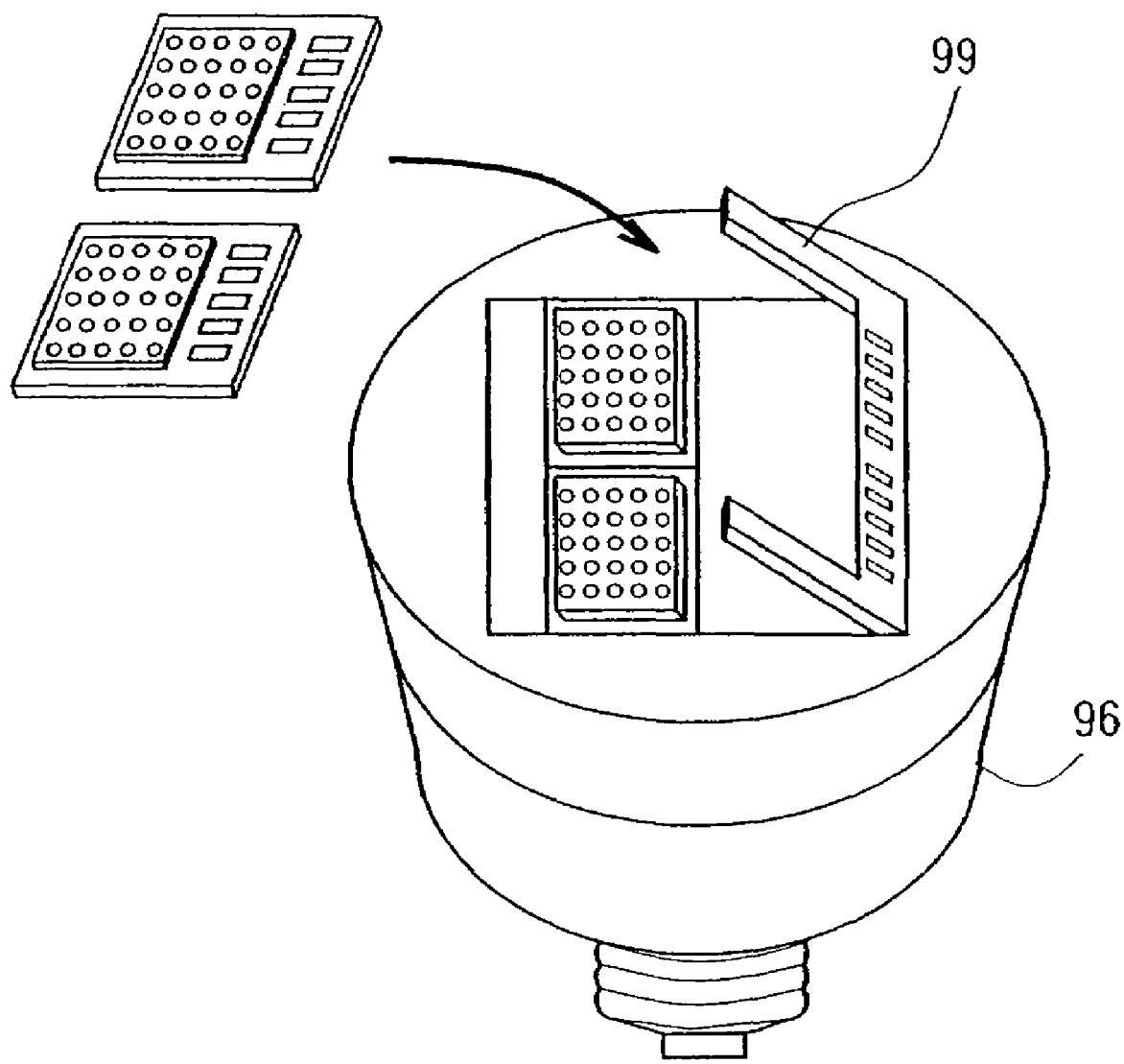
FIG. 21 illustrates another light bulb type LED illumination apparatus, in which multiple card-type LED illumination sources are inserted, as still another specific embodiment of an LED illumination apparatus according to the present invention.

Just one card-type LED illumination source 95 is supposed to be inserted into, or removed from, the illumination apparatus shown in FIG. 20. However, multiple card-type LED illumination sources may be inserted into, and removed from, one illumination apparatus. FIG. 21 illustrates another light bulb type LED illumination apparatus, in which multiple card-type LED illumination sources are fitted. The card-type LED illumination sources are pressed down and fixed by a pair of openable/closable fixing lids.

FIGS. 20 and 21 illustrate LED illumination apparatuses that can replace a light bulb type lamp. However, an LED illumination apparatus to replace a straight-tube fluorescent lamp or a circular-tube fluorescent lamp may also be realized by using the card-type LED illumination sources of the present invention. If an LED illumination apparatus is made in a shape similar to the conventional straight-tube fluorescent lamp or circular-tube fluorescent lamp, then an LED illumination apparatus according to the present invention may be used in an existent appliance in place of the conventional straight-tube or circular-tube fluorescent lamp.

Figure 22:
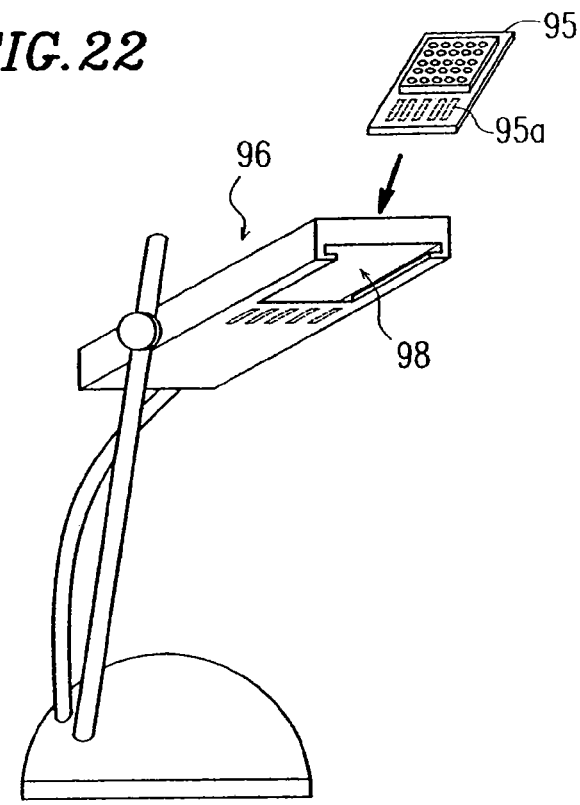
FIG. 22 illustrates a desk lamp type LED illumination apparatus as yet another specific embodiment of an LED illumination apparatus according to the present invention.

FIG. 22 illustrates a desk lamp type LED illumination apparatus. The body 96 of the illumination apparatus shown in FIG. 22 also includes a receiving portion 98 to store the card-type LED illumination source 95 therein. This receiving portion 98 includes a guide that can be used to slide and guide the card-type LED illumination source 95 thereon. The card-type LED illumination source 95 may be inserted into the receiving portion 98 of this illumination apparatus with its end including the feeder terminals 95a facing forward. When the card-type LED illumination source 95 reaches its predetermined position, the connection between the feeder terminals 95a and the connector electrodes is complete. Once fitted, the card-type LED illumination source 95 is firmly fixed there due to the frictional force and will not drop accidentally. Also, since the back surface of the substrate of the card-type LED illumination source 95 thermally contacts with the receiving portion 98, that contact portion is preferably made of a material with a good thermal conductivity.

Figure 23:
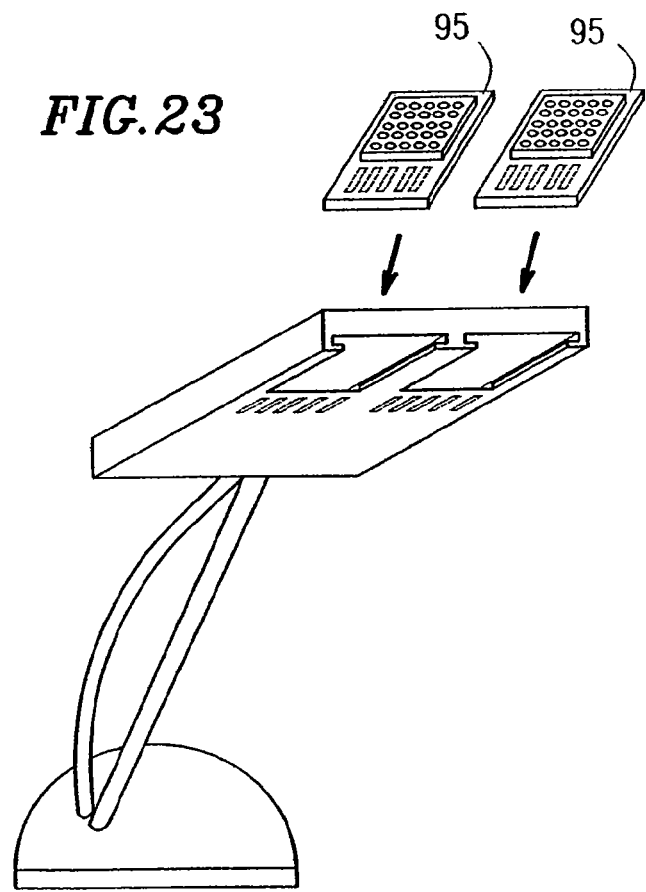
FIG. 23 illustrates another desk lamp type LED illumination apparatus, into/from which two card-type LED illumination sources are insertable and removable, as yet another specific embodiment of an LED illumination apparatus according to the present invention.

Just one card-type LED illumination source 95 is supposed to be inserted into, or removed from, the desk lamp type illumination apparatus shown in FIG. 22. However, multiple card-type LED illumination sources may be inserted into, and removed from, one illumination apparatus. FIG. 23 illustrates another desk lamp type LED illumination apparatus, into/from which two card-type LED illumination sources are inserted or removed.

Figure 24:
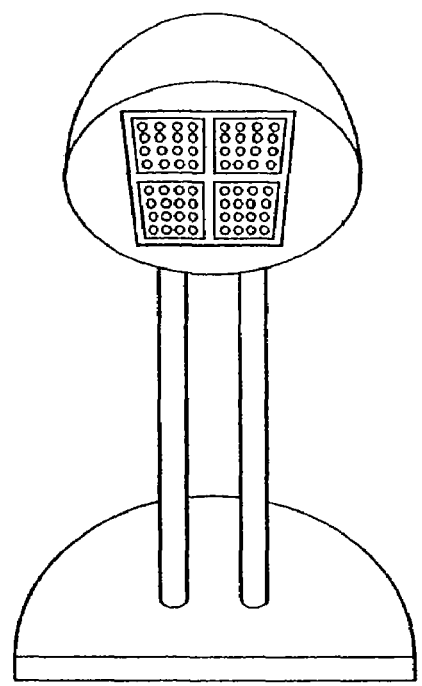
FIG. 24 illustrates still another desk lamp type LED illumination apparatus as yet another specific embodiment of an LED illumination apparatus according to the present invention.

FIG. 24 illustrates still another desk lamp type LED illumination apparatus. This LED illumination apparatus adopts a connector of the type shown in FIG. 21. That is to say, the card-type LED illumination sources are fixed by fixing lids onto the illumination apparatus. The user can easily open or close these fixing lids with fingers.

Figure 25:
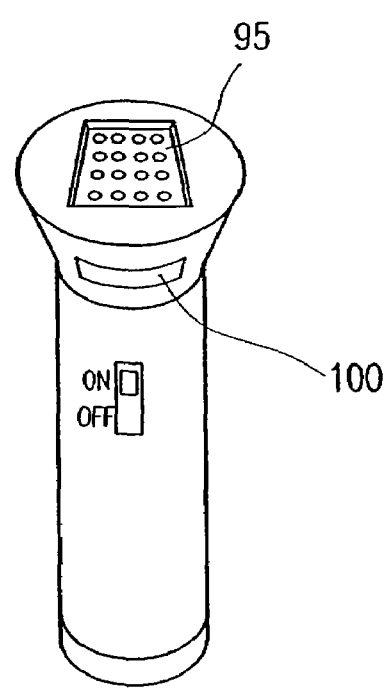
FIG. 25 illustrates a flashlight or penlight type LED illumination apparatus as yet another specific embodiment of an LED illumination apparatus according to the present invention.

FIG. 25 illustrates another LED illumination apparatus, which is portable as a flashlight or a penlight. This illumination apparatus includes a slot 100, through which the card-type LED illumination source 95 is inserted or removed. However, the card-type LED illumination source 95 may also be inserted or removed without using such a slot. The LED illumination apparatus shown in FIG. 25 can operate the card-type LED illumination source by a dry battery or a storage battery and has a portable structure.

Figure 26:
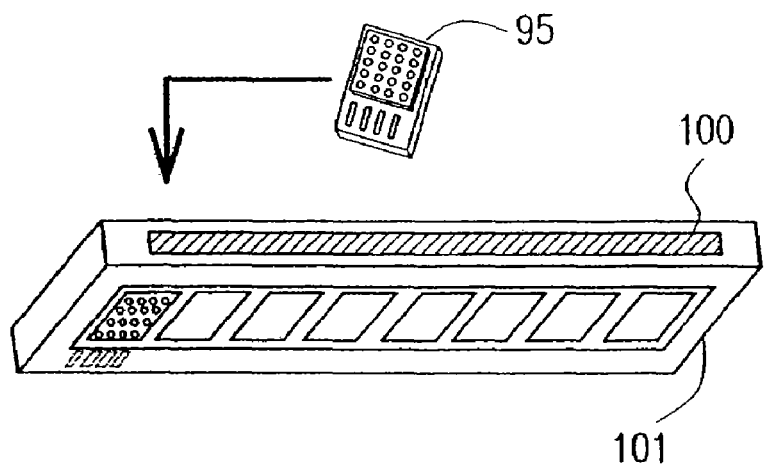
FIG. 26 illustrates an LED illumination apparatus that can replace a conventional illumination apparatus using a straight-tube fluorescent lamp.

FIG. 26 illustrates an LED illumination apparatus that can replace a conventional illumination apparatus using a straight-tube fluorescent lamp. The body 101 of this LED illumination apparatus includes a connector, into/from which multiple card-type LED illumination sources 95 can be inserted and removed. The card-type LED illumination sources 95 are inserted or removed through the slot 100 of the body 101.

It should be noted that the LED illumination apparatus shown in FIG. 26 is not supposed to replace a straight-tube fluorescent lamp itself but a desk lamp type illumination apparatus that uses the straight-tube fluorescent lamp.

Figure 27:
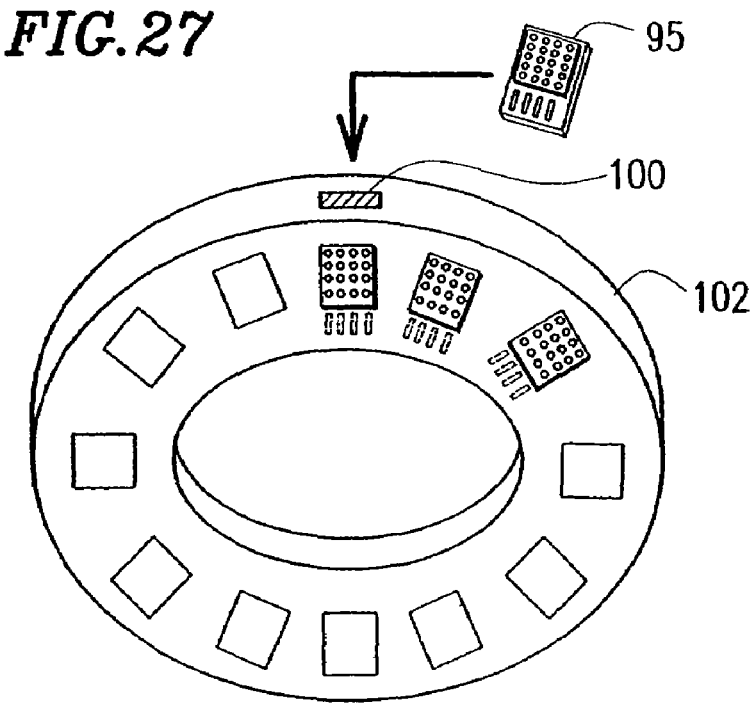
FIG. 27 illustrates an LED illumination apparatus, which can replace a conventional illumination apparatus using a circular-tube fluorescent lamp, as yet another specific embodiment of an LED illumination apparatus according to the present invention.

FIG. 27 illustrates an LED illumination apparatus, which can replace a conventional illumination apparatus that uses a circular-tube fluorescent lamp. The body 102 of this LED illumination apparatus includes a connector, into/from which multiple card-type LED illumination sources 95 can be inserted and removed. The card-type LED illumination sources 95 are inserted or removed through the slots 100 of the body 102.

Figure 28:
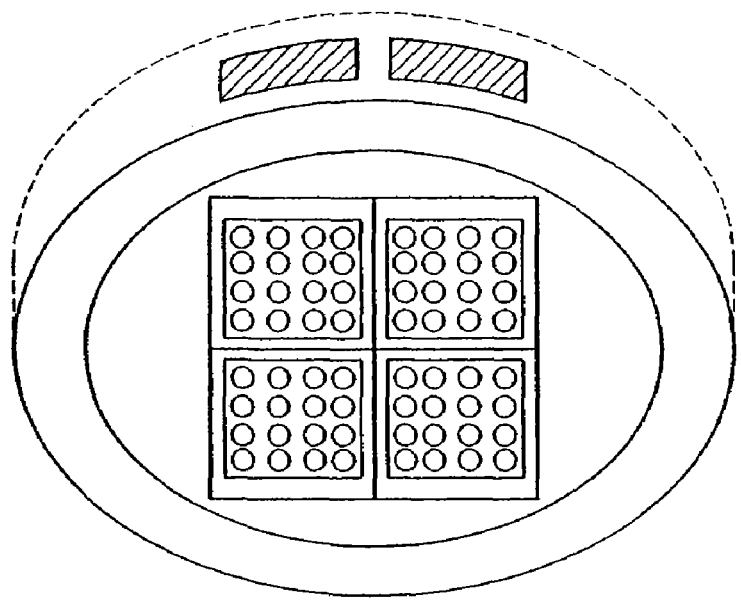
FIG. 28 illustrates a downlight type LED illumination apparatus as yet another specific embodiment of an LED illumination apparatus according to the present invention.

FIG. 28 illustrates a downlight type LED illumination apparatus. The LED illumination apparatus of the present invention can easily have a reduced thickness, and can be easily mounted as a downlight unit on the ceiling of a room or an automobile.

Figure 29:
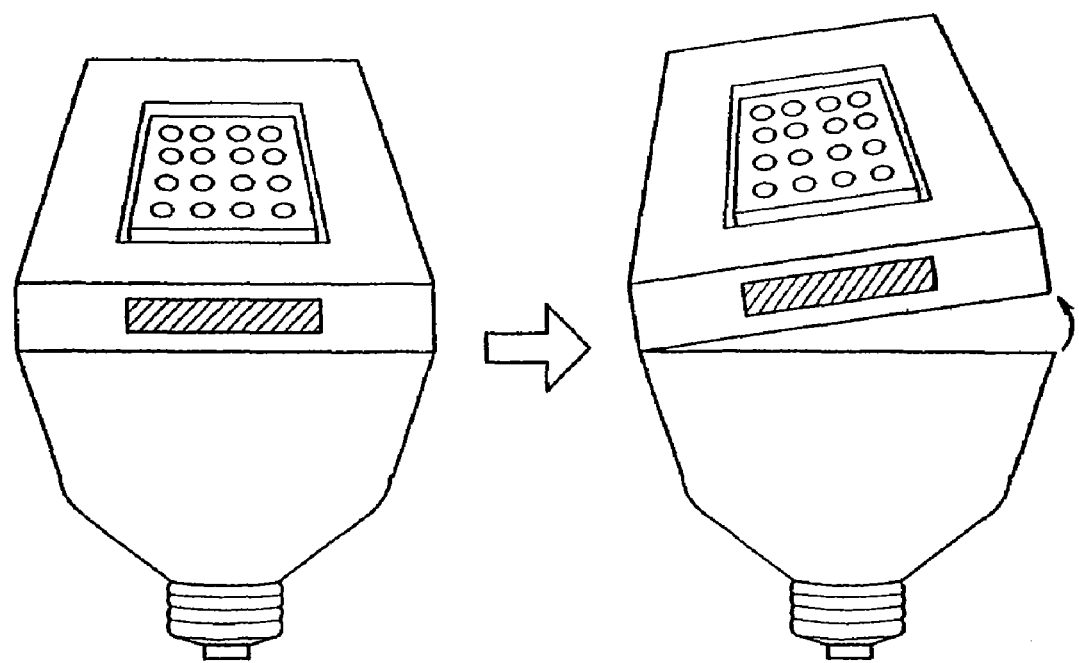
FIG. 29 illustrates an optical axis shifting type LED illumination apparatus as yet another specific embodiment of an LED illumination apparatus according to the present invention.

FIG. 29 illustrates an optical axis shifting type LED illumination apparatus. If its portion including the card-type LED illumination source fitted in is rotated to an arbitrary angle around a particular axis, the light outgoing direction can be easily changed into any desired direction.

Figure 30:
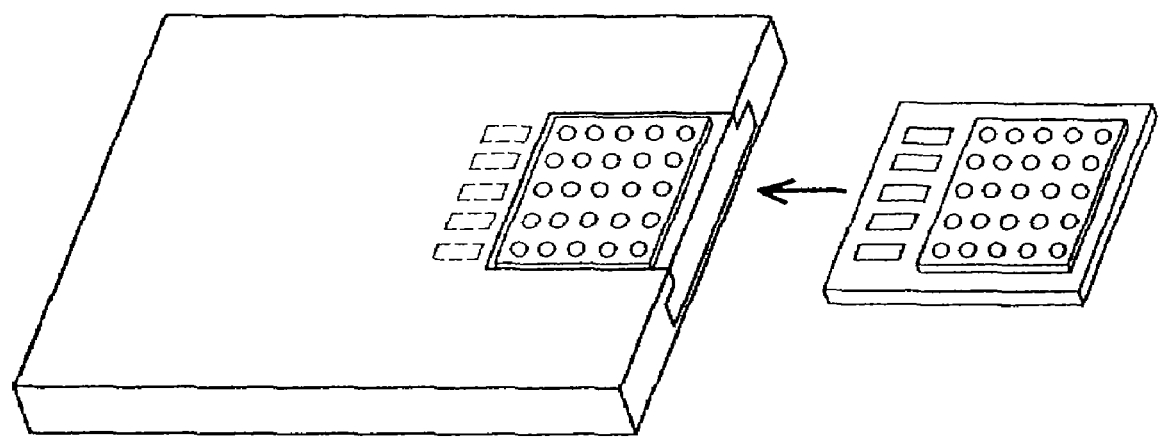
FIG. 30 illustrates a card-type LED illumination apparatus as yet another specific embodiment of an LED illumination apparatus according to the present invention.

FIG. 30 illustrates a card-type LED illumination apparatus. A battery with a reduced thickness such as a button battery is adopted, thereby reducing the overall thickness of the illumination apparatus itself. Such an LED illumination apparatus is thin and lightweight, and can be easily carried about.

Figure 31:
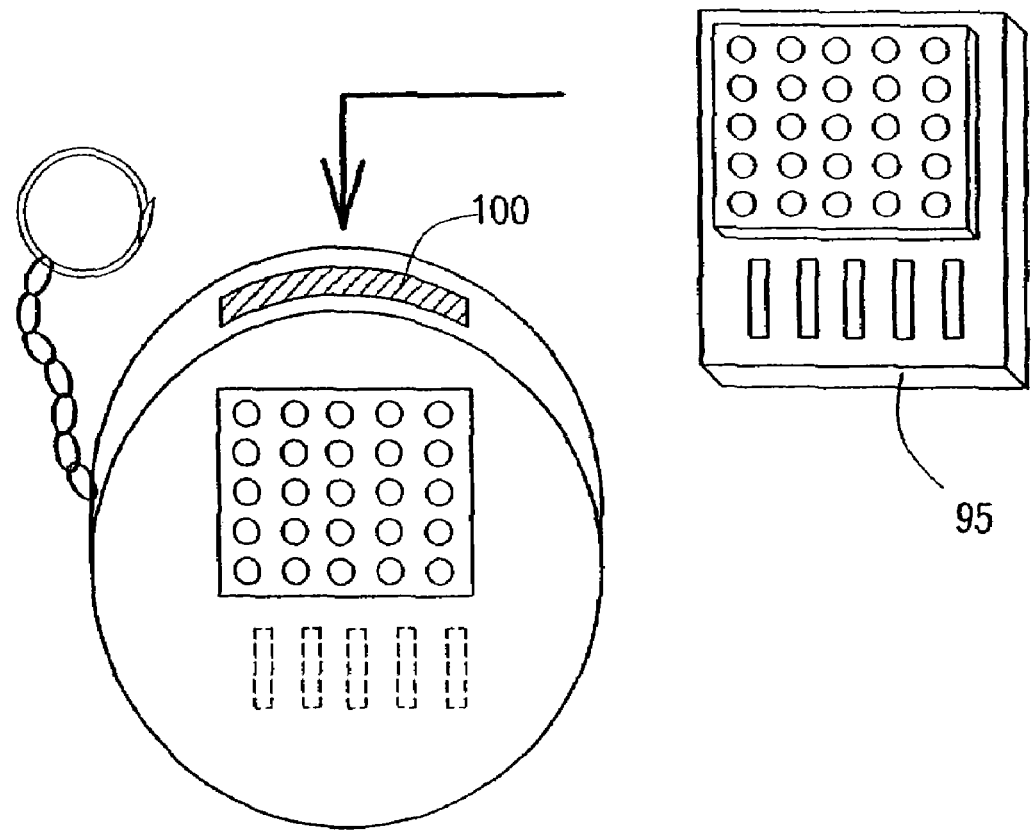
FIG. 31 illustrates a keychain type LED illumination apparatus as yet another specific embodiment of an LED illumination apparatus according to the present invention.

FIG. 31 illustrates a keychain type LED illumination apparatus. This LED illumination apparatus is also driven by a battery with a reduced thickness such as a button battery, has reduced size and weight, and easy to carry about conveniently.

Various specific embodiments of LED illumination apparatuses according to the present invention have been described with reference to FIGS. 20 through 31. However, the present invention is in no way limited to these specific embodiments but may also be implemented in numerous other ways.

As is clear from the foregoing description of specific embodiments, if those illumination apparatuses are designed such that each single illumination apparatus accepts one or multiple card-type LED illumination sources, then card-type LED illumination sources of a standardized type are easy to popularize. For example, the illumination apparatus shown in FIG. 21 is preferably designed so as to accept not so much one card-type LED illumination source with a big area as multiple card-type LED illumination sources, any of which is also insertable and removable into/from the illumination apparatus shown in FIG. 20. In that case, the card-type LED illumination sources can be mass-produced and the price of a single card-type LED illumination source can be decreased easily, which is one of the most important effects to achieve. Also, if an applicable card-type LED illumination source changes with the type of a specific illumination apparatus or the maker who produced it, such poor compatibility should frustrate the users. For that reason, the main portions of the card-type LED illumination source preferably have standardized functions or sizes.

Each of the card-type LED illumination sources according to the numerous embodiments described above uses LED bare chips that have been mounted thereon. Alternatively, a card-type LED illumination source including an organic EL film thereon may also be used. Thus, the "insertable/removable card-type LED illumination source including LEDs that have been mounted on one surface of a substrate" herein also refers to a card-type LED illumination source including an organic EL film on a heat-dissipating substrate.

As described above, the LED illumination apparatus of the present invention uses a card-type LED illumination source as an easily insertable/removable member, and therefore, has an extended life as an illumination apparatus and can replace any of the existent illumination apparatuses. A card-type LED illumination source having a configuration such as that shown in FIG. 12 is preferably used in such an LED illumination apparatus. However, card-type LED illumination sources for use in the LED illumination apparatus of the present invention are in no way limited to the specific embodiments described above.

Thus, a card-type LED illumination source with any of various configurations may be inserted into, and removed from, the LED illumination apparatus of the present invention. That is to say, the present invention is not limited to the specific preferred embodiments of card-type LED illumination sources that have been described above with reference to the accompanying drawings.

Also, the card-type LED illumination source of the present invention is applicable for use in not just illumination apparatuses but also any other type of apparatus. The insertable/removable card-type LED illumination source of the present invention may be used in an appliance that should emit as bright light as the illumination apparatus or in the light source section of any other apparatus, for example.

It should be noted that instead of mounting LED bare chips directly onto a substrate, LED elements (preferably of a surface bonded type), obtained by molding LED bare chips, may be bonded onto the substrate. In that case, the LED elements molded are fabricated separately. Thus, compared to directly mounting LED bare chips, the thermal resistance between the substrate and the LED bare chips increases. However, if the substrate has the above-described structure, even the substrate with those LED elements mounted exhibits better heat dissipation performance than the conventional one. Consequently, the substrate with the LED elements integrated thereon can exhibit improved heat dissipation performance.

INDUSTRIAL APPLICABILITY

The LED illumination apparatus and card-type LED light source of the present invention include: a connector to be connected to the insertable/removable card-type LED light source; and feeder terminals for the light source. The LED illumination apparatus further includes a lighting drive circuit. The card-type LED light source includes a metal base substrate and multiple LEDs. The metal base surface, which is the back surface of the substrate, thermally contacts with a portion of the illumination apparatus.

In this case, a metal plate with openings, including encapsulating resin lenses and functioning as an optical reflector and a heat spreader, is disposed on the metal base substrate. The LEDs, as well as the reflector, are encapsulated on the substrate.

Furthermore, the LED bare chips are directly bonded onto the substrate. The substrate has multiple conductive line pattern layers and also has a number of feeder terminals along one side of one of its surfaces. Also, in a preferred embodiment, the feeder terminals have multiple ground electrodes.

The LED illumination apparatus of the present invention uses an insertable/removable card shaped structure as its light source portion. Thus, the heat that has been generated from respective LED elements of the light source can be dissipated much more smoothly. In addition, only a light source with its life ended can be replaced with a brand-new light source. Thus, the remaining structure of the illumination apparatus, other than the light source, can be used for a long time.

The card-type LED illumination source of the present invention realizes high-density arrangement of LED elements, excellent heat dissipation performance, and significant increase in the extraction efficiency of the light generated at the same time. Thus, card-type LED illumination sources can be commercially viable products.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An LED illumination source comprising
a heat dissipating substrate comprising a metal plate and an insulating layer provided thereon;
LED bare chips mounted on a surface of the substrate;
an optical reflector with holes to surround the LED bare chips, the optical reflector being provided on the surface of the substrate on which the LED bare chips are mounted; and
a resin for encapsulating the entire of the optical reflector on the substrate, the resin molding each of the LED bare chips and functioning as an optical lens for each of the LED bare chips.

2. The LED illumination source of claim 1, wherein the substrate includes a line pattern provided thereon and the insulating layer comprises a composite material with an inorganic filler and a resin composition.

3. The LED illumination source of claim 2, wherein the thermal resistance between the back surface of the metal base substrate, on which none of the LED bare chips is mounted, and the LED bare chips is 10° C./W or less.

4. The LED illumination source of claim 3, wherein the thermal resistance is 5° C. or less.

5. The LED illumination source of claim 3, wherein the thermal resistance is 2° C./W or less.

6. The LED illumination source of claim 2, wherein the inorganic filler comprises at least one material selected from the group consisting of $Al_2O_3$, $MgO$, $BN$, $SiO_2$, $SiC$, $Si_3N_4$ and $AlN$.

7. The LED illumination source of claim 1, wherein the LED bare chips are provided as either surface mount devices (SMDs) or chip elements.

* * * * *

UNITED STATES PATENT AND TRADEMARK OFFICE
CERTIFICATE OF CORRECTION

PATENT NO. : 7,250,637 B2
APPLICATION NO. : 11/277952
DATED : July 31, 2007
INVENTOR(S) : Masanori Shimizu et al.

It is certified that error appears in the above-identified patent and that said Letters Patent is hereby corrected as shown below:

Title page, section (57):

In line 3 of the Abstract, "LEI)" should read -- LED --.

Signed and Sealed this

Twentieth Day of November, 2007

JON W. DUDAS
*Director of the United States Patent and Trademark Office*